(12) United States Patent
Chen et al.

(10) Patent No.: US 8,255,843 B2
(45) Date of Patent: Aug. 28, 2012

(54) METHOD OF MANUFACTURING STRAINED-SILICON SEMICONDUCTOR DEVICE

(75) Inventors: Yun-Hsiu Chen, Hsin Chu (TW); Syun-Ming Jang, Hsin-Chu (TW); Pang-Yen Tsai, Jhu-Bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 57 days.

(21) Appl. No.: 12/870,365

(22) Filed: Aug. 27, 2010

(65) Prior Publication Data

US 2011/0008951 A1 Jan. 13, 2011

Related U.S. Application Data

(63) Continuation-in-part of application No. 11/272,938, filed on Nov. 14, 2005, now abandoned.

(51) Int. Cl.
*G06F 17/50* (2006.01)

(52) U.S. Cl. ............... 716/55; 716/54; 438/14

(58) Field of Classification Search ........... 257/E21.562, 257/E21.633, E21.642, E21.703; 438/41, 438/44, 142, 222, 226, 269, 300, 360, 363, 438/413, 429, 442, 481, 601, 14, 16, 351, 438/416; 716/50–56
See application file for complete search history.

(56) References Cited

U.S. PATENT DOCUMENTS

| | | | |
|---|---|---|---|
| 6,054,362 A * | 4/2000 | Chuang | 438/405 |
| 6,409,829 B1 * | 6/2002 | Bastek et al. | 117/95 |
| 6,567,964 B2 * | 5/2003 | Shin et al. | 716/55 |
| 6,727,567 B2 | 4/2004 | Bastek et al. | |
| 6,927,414 B2 * | 8/2005 | Ouyang et al. | 257/20 |
| 7,013,446 B2 * | 3/2006 | Ohba et al. | 716/122 |
| 7,129,139 B2 * | 10/2006 | Murthy et al. | 438/299 |
| 7,305,651 B2 * | 12/2007 | Cao | 716/52 |
| 7,332,380 B2 * | 2/2008 | Matsuda | 438/140 |
| 7,393,755 B2 * | 7/2008 | Smith et al. | 438/435 |
| 7,554,139 B2 * | 6/2009 | Inoue et al. | 257/288 |
| 2004/0256614 A1 | 12/2004 | Ouyang et al. | |
| 2005/0093021 A1 | 5/2005 | Ouyang et al. | |
| 2006/0228850 A1 | 10/2006 | Tsai et al. | |

OTHER PUBLICATIONS

Ishitani, A., et al., "Local Loading Effect in Selective Silicon Epitaxy," Japanese Journal of Applied Physics, vol. 23, No. 6, Jun. 1984, pp. L391-L393.

* cited by examiner

*Primary Examiner* — Kiesha Bryant
*Assistant Examiner* — Eric Ward
(74) *Attorney, Agent, or Firm* — Slater & Matsil, L.L.P.

(57) ABSTRACT

A method for fabricating a strained-silicon semiconductor device to ameliorate undesirable variation in selectively grown epitaxial film thickness. The layout or component configuration for the proposed semiconductor device is evaluated to determine areas of relatively light or dense population in order to determine whether local-loading-effect defects are likely to occur. If a possibility of such defects occurring exists, a dummy pattern of epitaxial structures may be indicated. If so, the dummy pattern appropriate to the proposed layout is created, incorporated into the mask design, and then implemented on the substrate along with the originally-proposed component configuration.

19 Claims, 19 Drawing Sheets

Chip 1, 1000um x 1000um blocks

| 1 | 4 | 3 | 2 | 3 | 3 | 3 | 4 | 4 | 2 |
|---|---|---|---|---|---|---|---|---|---|
| 3 | 14 | 12 | 13 | 12 | 12 | 12 | 11 | 14 | 3 |
| 4 | 15 | 14 | 13 | 14 | 14 | 14 | 14 | 15 | 4 |
| 4 | 15 | 13 | 13 | 11 | 11 | 13 | 11 | 14 | 4 |
| 3 | 14 | 13 | 12 | 14 | 14 | 14 | 14 | 14 | 3 |
| 3 | 13 | 14 | 13 | 14 | 13 | 13 | 15 | 15 | 3 |
| 3 | 15 | 15 | 14 | 13 | 14 | 13 | 15 | 14 | 3 |
| 4 | 13 | 14 | 13 | 14 | 15 | 14 | 14 | 12 | 4 |
| 4 | 12 | 14 | 11 | 11 | 14 | 14 | 14 | 14 | 5 |
| 2 | 10 | 5 | 5 | 5 | 3 | 5 | 5 | 7 | 2 |

Figure 8

Chip 2, 1000um x 1000um blocks

| 0 | 0 | 2 | 2 | 1 | 3 | 3 | 1 | 2 | 1 | 1 | 1 | 1 | 1 | 2 | 1 | 4 | 6 | 3 |
|---|---|---|---|---|---|---|---|---|---|---|---|---|---|---|---|---|---|---|
| 0 | 0 | 4 | 3 | 3 | 6 | 7 | 3 | 4 | 3 | 2 | 2 | 3 | 3 | 4 | 3 | 10 | 11 | 6 |
| 1 | 1 | 12 | 13 | 12 | 11 | 12 | 12 | 12 | 11 | 13 | 12 | 13 | 12 | 12 | 13 | 10 | 4 | |
| 1 | 1 | 11 | 13 | 12 | 13 | 13 | 13 | 13 | 13 | 13 | 13 | 12 | 12 | 12 | 12 | 9 | 1 | |
| 1 | 2 | 12 | 13 | 13 | 13 | 13 | 13 | 13 | 13 | 13 | 13 | 13 | 12 | 13 | 12 | 9 | 1 | |
| 2 | 2 | 12 | 13 | 13 | 13 | 13 | 13 | 13 | 13 | 13 | 13 | 14 | 13 | 13 | 10 | 5 | | |
| 1 | 2 | 13 | 13 | 13 | 13 | 13 | 13 | 13 | 13 | 13 | 13 | 13 | 12 | 13 | 12 | 13 | 10 | 3 |
| 4 | 6 | 12 | 13 | 13 | 13 | 13 | 13 | 13 | 13 | 13 | 12 | 12 | 12 | 12 | 7 | 0 | | |
| 8 | 11 | 12 | 13 | 13 | 13 | 13 | 13 | 13 | 13 | 13 | 13 | 12 | 12 | 13 | 12 | 10 | 0 | |
| 7 | 10 | 11 | 14 | 14 | 14 | 14 | 14 | 14 | 14 | 14 | 14 | 14 | 13 | 14 | 13 | 12 | 11 | 2 |
| 6 | 10 | 10 | 13 | 13 | 13 | 13 | 13 | 13 | 13 | 13 | 13 | 12 | 13 | 10 | 12 | 13 | 5 | |
| 8 | 11 | 13 | 12 | 12 | 12 | 12 | 12 | 12 | 12 | 12 | 12 | 12 | 11 | 11 | 13 | 13 | 9 | |
| 1 | 2 | 12 | 13 | 13 | 13 | 13 | 13 | 13 | 13 | 13 | 13 | 13 | 12 | 13 | 13 | 9 | | |
| 2 | 2 | 13 | 13 | 13 | 13 | 13 | 13 | 13 | 13 | 13 | 13 | 12 | 12 | 12 | 12 | 8 | | |
| 1 | 2 | 12 | 13 | 13 | 13 | 13 | 13 | 13 | 13 | 13 | 13 | 13 | 12 | 11 | 12 | 12 | 6 | |
| 1 | 2 | 11 | 13 | 13 | 13 | 13 | 13 | 13 | 13 | 13 | 13 | 13 | 12 | 12 | 13 | 6 | | |
| 1 | 1 | 11 | 13 | 13 | 13 | 13 | 13 | 13 | 13 | 13 | 12 | 13 | 13 | 12 | 13 | 12 | 13 | 6 |
| 0 | 1 | 9 | 10 | 8 | 9 | 10 | 9 | 9 | 9 | 9 | 9 | 10 | 9 | 9 | 8 | 13 | 12 | 6 |
| 0 | 0 | 2 | 2 | 1 | 4 | 5 | 1 | 2 | 1 | 1 | 1 | 1 | 2 | 1 | 4 | 8 | 3 | |

Figure 9

METHOD OF MANUFACTURING STRAINED-SILICON SEMICONDUCTOR DEVICE

This application is a continuation in part of U.S. patent application Ser. No. 11/272,938, filed Nov. 14, 2005, and entitled "Method of Manufacturing Strained-Silicon Semiconductor Device," which application is hereby incorporated herein by reference.

TECHNICAL FIELD

The present invention relates generally to a method for fabricating semiconductors, and more particularly to a method for fabricating a semiconductor device to reduce the undesirable effects of local loading while employing selective epitaxial growth (SEG) in a strained silicon fabrication.

BACKGROUND

Electronic devices using semiconductors are utilized in a wide variety of applications. They provide the computing capability and data storage that make possible not only the operation of computers, large and small, but also things like electronic gaming devices, home entertainment systems, and telephones and other communications equipment. Advances in technology have made possible not only the construction of these and other components, but have made them more capable, more portable, and more affordable as well.

A semiconductor is actually a material that is a conductor of electricity under some conditions, but not others. Silicon, for example, may be treated with a dopant such as ionized boron or phosphorus so that its conducting capabilities may be turned on or off by the presence (or absence) of an electrical field. Small electronic components that exploit this property may be constructed. One such component is a transistor. A transistor is a small switch that can be used to control the flow of a (typically small) amount of electricity. Computers, for example, employ thousands of these tiny switches to send the electrical signals that allow them to quickly perform complex calculations.

An exemplary transistor is shown in FIG. 1. FIG. 1 is an illustration showing in cross-section the basic components of a MOSFET 10 (metal-oxide semiconductor field effect transistor). The doped silicon forms the substrate 15 upon which various devices may be fabricated. The transistor includes a gate 20 having a gate electrode 25 made of a conductive material such as a metal, and is separated from the substrate 15 by a thin gate oxide layer 30. In the transistor 10 of FIG. 1, spacers 35 are positioned on either side of the gate electrode 25. Conductive regions called a source 40 and a drain 45 are formed in the substrate 15 on either side of the spacers 35. Source 40, drain 45, and gate electrode 25 are each coupled, respectively, to electrical contacts 50, 51, 52, each of which may in turn be connected to external components (not shown) so that electrical current may flow to and from these transistor components when appropriate. When a small electrical charge is applied to gate electrode 25 via contact 52, then current will flow between drain 45 and source 40 via channel region 5. These MOSFET transistors are very small, for example, the gate electrode 25 of MOSFET 10 may be no more than 100 nm in width.

As mentioned above, thousands, or even millions of these transistors may be employed in the manufacture of even a small personal computer. Because of their small size, however, a great many transistors may be formed on a single substrate, as illustrated in FIG. 2. FIG. 2 is an illustration showing in cross-section a semiconductor device 55, which is a substrate 15 populated with a number of individual MOSFET transistors 10. Note that for convenience, all of these devices are shown to be identical, but the formation of other types of devices as well is both possible and typical (although there are usually a great many substantially-identical semiconductor devices present). The component transistors 10 in FIG. 2 being substantially identical, selected reference numbers have been applied to only one of them. As with FIG. 1, the external connections to these devices are not illustrated; some of the transistors with be connected to each other, and some to external devices (also not shown). Note also that the term 'semiconductor device' is being used broadly to include either a complete, fabricated unit or simply a portion of one. As should be apparent, FIG. 2 illustrates only a small portion of a complete unit.

This entire unit (not shown), once completed, is enclosed in the familiar (usually black) plastic packaging to form a chip. A number electrical leads (or pins) typically extend from the chip to facilitate connections between internal and external circuits. There are a number of process steps, however, that the semiconductor goes through prior to packaging. The processes used for fabricating semiconductor devices are both numerous and varied, but the overall methodology can be generally described.

The process typically begins with the provision of the substrate, such as substrate 15 shown in FIGS. 1 and 2. The substrate 15 is often a thin slice of silicon called a wafer. The silicon wafer then undergoes doping, followed by a series of steps in which a variety of materials are deposited or selectively etched away. In this manner, the MOSFET transistors 10 shown in FIG. 2 may be fabricated onto the surface of wafer substrate 15. Although not shown in FIG. 2, these transistors (and other devices as well) will be connected together to form circuits that perform the various functions required of the chip.

Notwithstanding the advances that have already been made, there is a constant drive in the semiconductor industry to create ever-denser collections of electronic devices on a single chip. This allows for greater functionality for the chip or permits it to be made smaller, or both. The speed of the chips operation may also be enhanced by the reducing the size of the devices formed on the wafer and placing them closer together. Components are now so small, however, that advances in speed are not necessarily resulting simply from reductions in size.

One response is to use strained silicon in the construction of semiconductor devices. Strained silicon takes advantage of a characteristic of the substrate material, namely that in certain applications silicon allows electrical-charge carriers to pass more quickly when its crystal lattice is stretched (or compressed) a small amount. In one way to accomplish this stretching, an alloy of silicon and germanium is deposited onto an existing silicon layer. On top of this silicon-germanium layer is then deposited a thin layer of silicon. The germanium in the silicon-germanium alloy causes the atoms in the overlying silicon layer to be somewhat stretched apart from their normal orientation—producing the strain of the strained silicon. One problem with using the selective epitaxial growth (SEG) strained-silicon approach is local loading. Local loading occurs where, for example, the wafer is more densely populated in one region than in another. For example, in FIG. 2, region X is a region of lower pattern density. This may, for example, be associated with an I/O function, which requires a smaller number of components than region Y, which is a higher pattern density area and may be, for example, a memory-circuit portion of the device. This tends to cause a lack of planarity when SEG is performed, a significantly undesirable condition. This can lead to local-loading-effects, such as undesirable voids forming in the source and drain regions of the more isolated transistors. FIG. 3 is an illustration of the semiconductor device 55 shown in FIG. 2 (where it is more ideally illustrated), illustrating the presence of voids 60 formed in the silicon-germanium (SiGe) source and drain regions. Void 60 may be an area of thinner SiGe or result from an incomplete SiGe deposition. These types of voids could degrade device performance, and could also serve as the defect source in subsequent process steps. Needed then is a manner of taking advantage of the benefits that the strained-silicon process SEG can produce, while at the same time avoiding its undesirable consequences, such as the source and drain voids mentioned above. The present invention provides just such a solution.

SUMMARY OF THE INVENTION

The present invention is directed to a method of fabricating a semiconductor device using selective epitaxial growth to form portions of electrical components on a semiconductor wafer such as for the source and drain of a MOSFET. In one aspect, the present invention is a method of fabricating a semiconductor device including providing a substrate for supporting the fabrication of at least one electrical component, evaluating a proposed component layout to determine whether local-loading-effect reduction is required, if it is so determined, creating a dummy pattern for selective epitaxial growth, and implementing the dummy pattern on the substrate. The dummy pattern may include one or more recesses into which a material will be epitaxially grown, and then electrically isolated so that it reduces or eliminates local-loading-effect defects but does not interfere with operation of the semiconductor device.

In another aspect, the present invention is a semiconductor device comprising a substrate forming a first recess and at least a second recess, the first recess and the at least second recess each containing an epitaxially-grown material, the epitaxially-grown material in the first recess forming a component part of an electrical device, forming part of the originally-designed component layout, and the epitaxially-grown material in the at least second recess is electrically isolated, forming a dummy pattern, according to an embodiment of the present invention.

The epitaxial regions may be formed of doped silicon or a silicon-germanium (SiGe) alloy. Carbon may also form or be included in the epitaxial-region material, for example using SiC. In one embodiment, an epitaxial material according to the formula $Si_{1-x}Ge_x$ may be used. Different materials may, in some instances, be used for different epitaxial regions, although this is not typical. The epitaxial regions formed in recesses may, for one example, be formed on the substrate using an ultra-high vacuum chemical-vapor deposition (UHV-CVD) process. Other processes known or developed in the art may be used as well.

In another aspect, a method embodiment is provided. A method for forming a semiconductor device comprises receiving a design layout configured to form MOS transistors on the semiconductor device, including regions for selective epitaxial growth; and partitioning the design layout into sub blocks. The method performs, for each sub block, determining the local epitaxial concentration ratio percentage within the sub block; identifying sub blocks in which the local epitaxial concentration ratio percentage of the selected sub block is below a predetermined minimum percentage threshold; and for the identified sub blocks, increasing the local epitaxial concentration ratio percentage by modifying the design layout to add selective epitaxial growth material to dummy structures within the identified sub blocks. The method continues by using the design layout including the modifications made to the design layout, performing selective epitaxial growth on a semiconductor substrate to form epitaxial material in the regions and on the dummy structures.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 illustrates in a table form the local concentration ratio percentages for epitaxial layer coverage for partition sub blocks for an integrated circuit design;

FIG. 9 illustrates in a table form the local concentration ratio percentages for epitaxial layer coverage for partition sub blocks for another integrated circuit design;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The present invention will be described with respect to preferred embodiments in a specific context, namely a semiconductor device consisting of a substrate populated with a plurality of substantially identical transistors. The invention may also be applied, however, to other semiconductor devices as well.

The present invention involves a method of manufacturing semiconductor devices. Specifically, the present invention is directed at a method of implementing selective epitaxial growth (SEG) with reduced local-loading effects in order to produce a more uniform epitaxial layer. The method of the present invention will now be presented in terms of the fabrication of a semiconductor device including a plurality of transistors on a silicon substrate; although this embodiment is exemplary and other applications are possible.

Figure 4A:
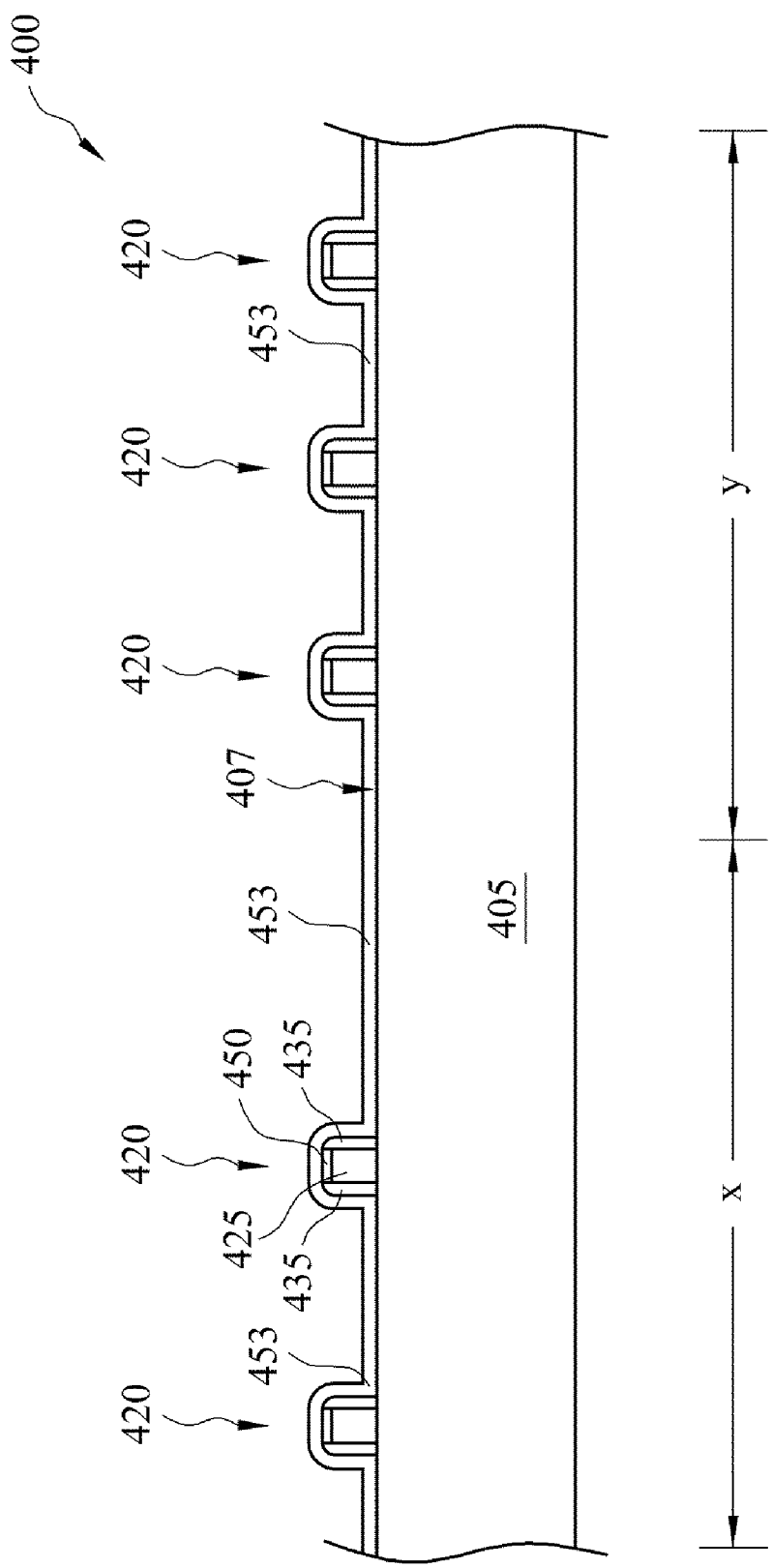
FIGS. 4A through 4F are cross-sectional representations illustrating a semiconductor device at various stages of fabrication according to an embodiment of the present invention.

FIGS. 4A through 4F are cross-sectional representations illustrating the semiconductor device 400 at various stages of fabrication according to an embodiment of the present invention. The process begins with the provision of a suitable silicon-wafer substrate 405, populated with a plurality of gate structures 420 (other suitable substrate materials may, of course, be used as well). In this embodiment, prior to lithography an OX/SiN layer 453 is deposited over the surface 407 of substrate 405. This stage of the fabrication is illustrated in FIG. 4A. OX/SiN layer 453 may, for example, be formed of silicon dioxide ($SiO_2$) or silicon nitride (SiN).

Figure 1:
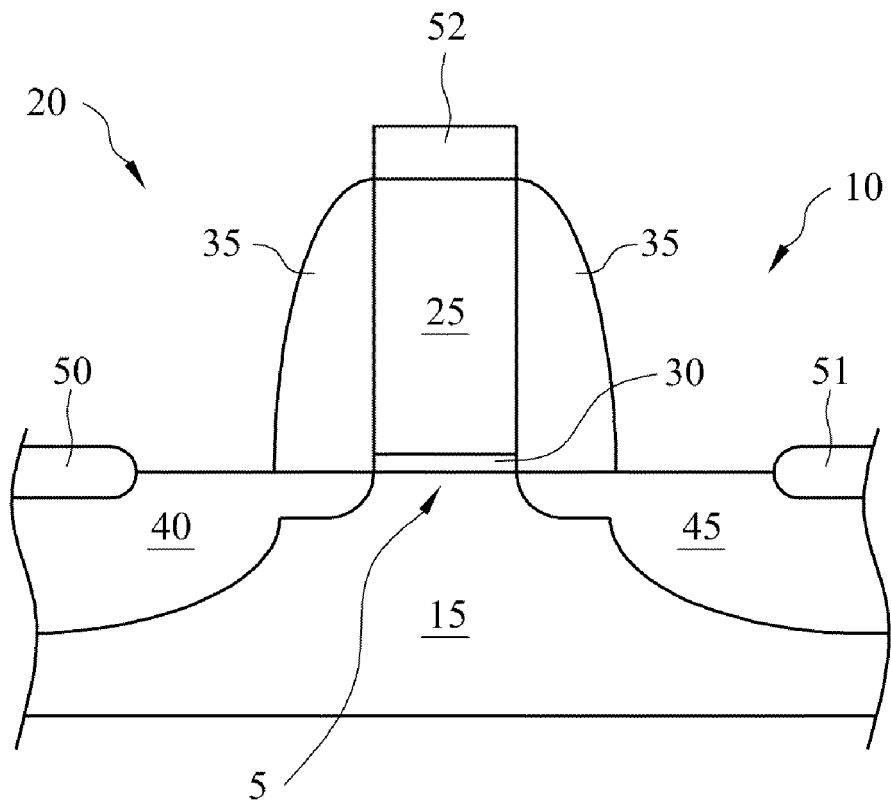
FIG. 1 is an illustration showing in cross-section the basic components of a MOSFET according to the prior art.
Figure 2:
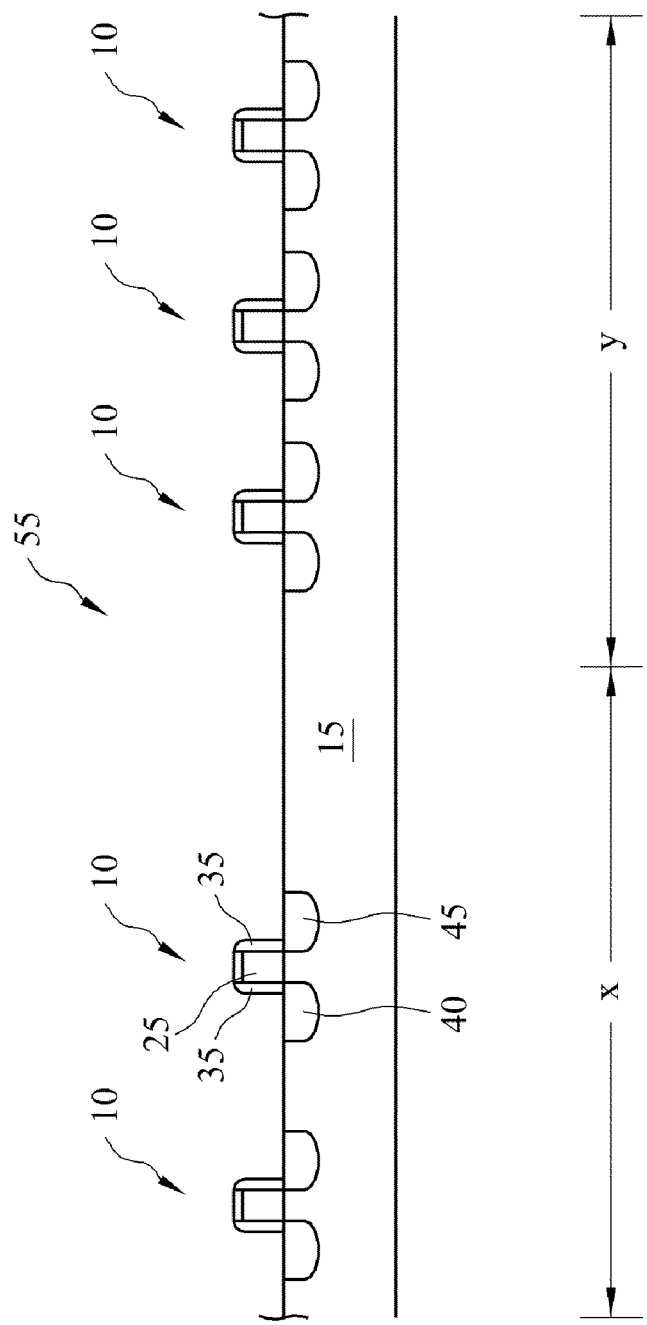
FIG. 2 is an illustration showing in cross-section a semiconductor device, which is a substrate populated with a number of individual MOSFETs such as or similar to the one illustrated in FIG. 1.
Figure 3:
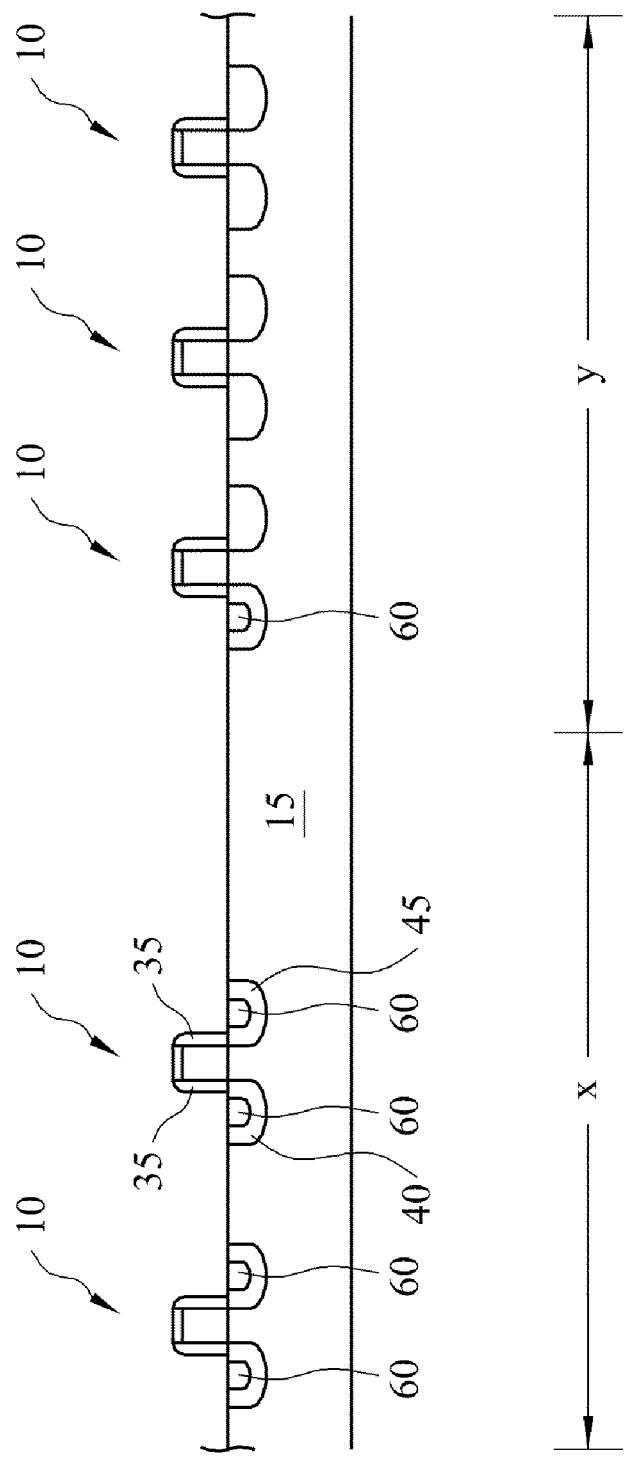
FIG. 3 is an illustration of the semiconductor device of FIG. 2, illustrating the presence of defects in the source and drain regions.

Each of the gate structures shown in FIGS. 4A through 4F are similar in construction though not necessarily identical to the analogous devices shown in FIGS. 1 through 3. As with FIGS. 2 and 3, the component parts of gate structure 420 are labeled with reference numbers on only one such gate structure, the others for convenience being considered substantially identical. Similar to the transistor 10, illustrated in FIG. 1, transistor 420 includes a gate electrode 425. At the top of gate electrode 425 is an electrical contact 450. Spacers 435 are disposed on either side of gate electrode 425. The same transistor distribution of FIGS. 2 and 3 is also used, although many other layout configurations are possible. It should be apparent, however, that the layout of these components is like that of FIGS. 2 and 3, meaning that non-uniform EPI layer growth attributable to the local-loading effect are likely to be a risk if selective epitaxial growth (SEG) is undertaken. In the embodiment of FIGS. 4A through 4F, this process is to be employed.

Figure 4B:
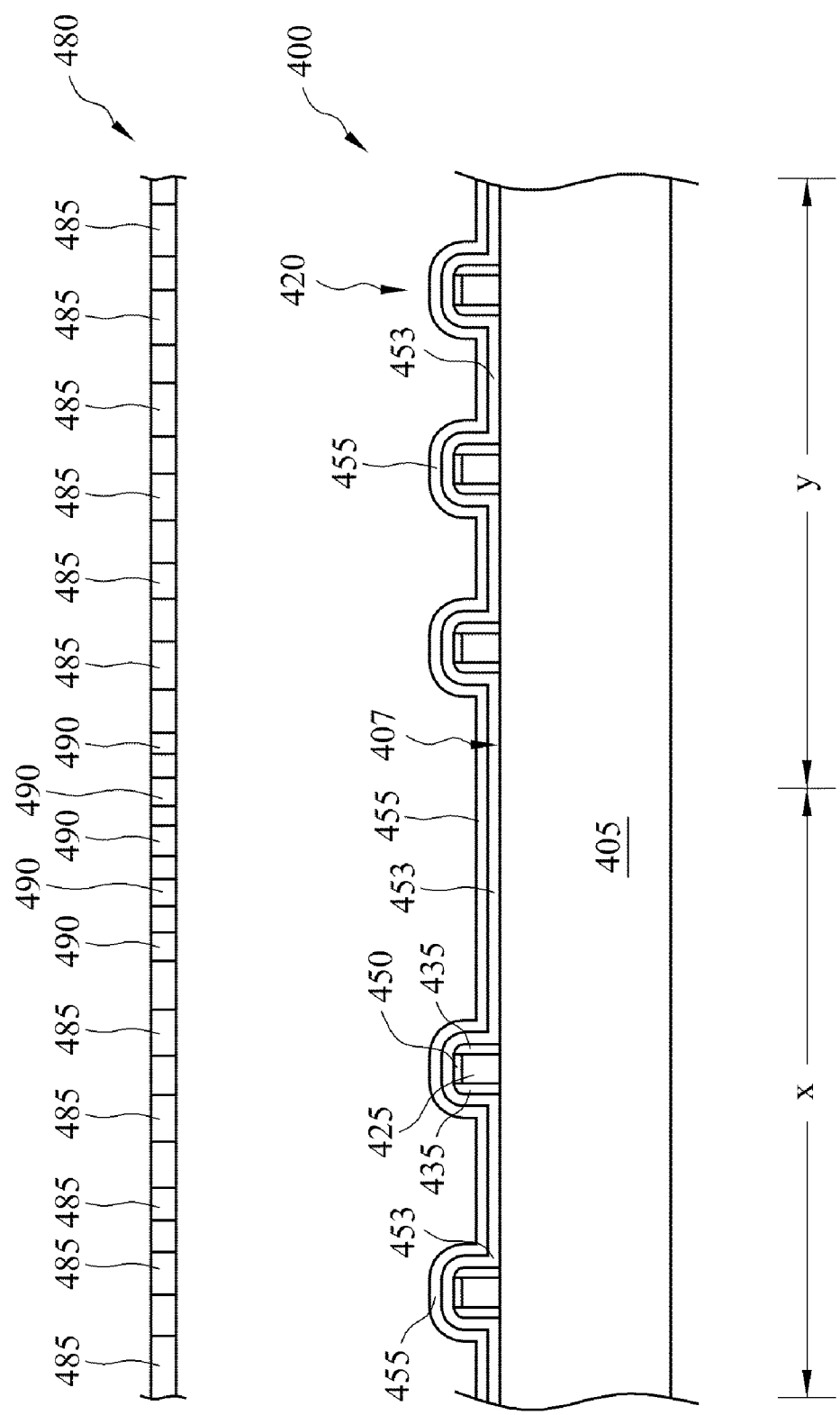

As illustrated in FIG. 4B, a photoresist layer 455 is applied to the upper surface 407 of the wafer substrate 405. Photoresist, or simply resist, is a photosensitive material that may be patterned as part of a fabrication process known as photolithography. Photoresist may also be applied as a decal (not shown) having a series of openings already patterned into it. In the embodiment of FIGS. 4A through 4F, however, an optical mask is provided (though not shown), the mask having a series of openings (or transparent or semitransparent areas) to allow the passage of light from a light source to certain areas of the photoresist. These areas are determined in accordance with the method of the present invention.

In order to implement a preferred embodiment of the present invention, it is determined from the layout of components on the wafer surface (or on some related consideration), where there may be a risk of local-loading-effect defects. These are then mitigated by the development and implementation of a dummy pattern implementation. The term "dummy pattern" refers to a collection of areas selected for epitaxial growth in addition to those actually required by the design layout. For example, in FIG. 4B it should be apparent that there are some regions that are less populated than others. Specifically, the region Y will require the growth of relatively more source and drain structures through selective epitaxy in order to complete the transistors in that region. Region X, on the other hand, has fewer structures and will not require as many.

Whether a dummy pattern is necessary at all, and if so, how it will be configured, is determined on a design-by-design basis according to pre-determined design criteria. But in general, the dummy pattern will be formulated to populate the epitaxial growth regions more evenly with respect to each other. Other factors may also be taken into account. In the embodiment of FIGS. 4A through 4F, the dummy pattern is implemented by altering the mask 480 design so that light from the light source illuminated the resist portions associated with the dummy pattern as well as with the source and drain regions. As can be seen in FIG. 4B, mask 480, shown in cross-section, forms a series of openings through which light will pass when photolithography is performed. In another embodiment (not shown) transparent or translucent regions may be used instead of some or all of the openings. The openings in mask 480 include layout openings 485, which will facilitate the formation of recesses for actual design-layout features. Dummy openings 490 will facilitate formation of the dummy-pattern recesses according to the present invention.

Figure 4C:
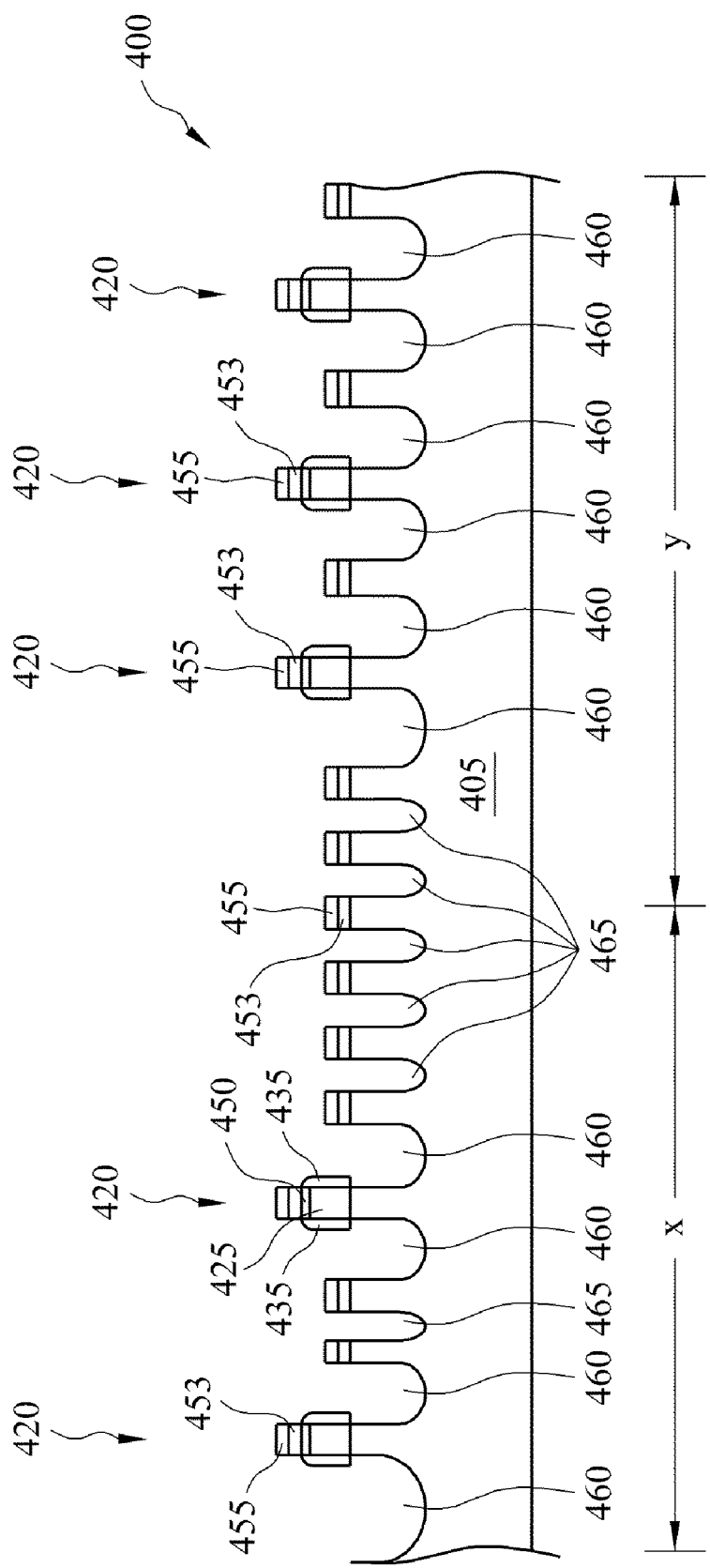

Selectively illuminating the photoresist layer 455 through the optical mask and developing the illuminated resist causes some areas to become harder to remove with a selected solvent than others. Following illumination and development, the selected solvent (or other agent) is used to create the resist pattern. A dry etching step is then performed, etching away the substrate to create recesses 460 and recesses 465. These recesses are illustrated in FIG. 4C. As should be apparent, the recesses are formed by the etching in areas where the resist has previously been removed, the etching agent being selected to achieve this affect. The recesses 460 are formed for formation of the source and drain regions according to the original design, and recesses 465 are those that are created as part of the dummy-pattern process according to this embodiment of the present invention.

Figure 4D:
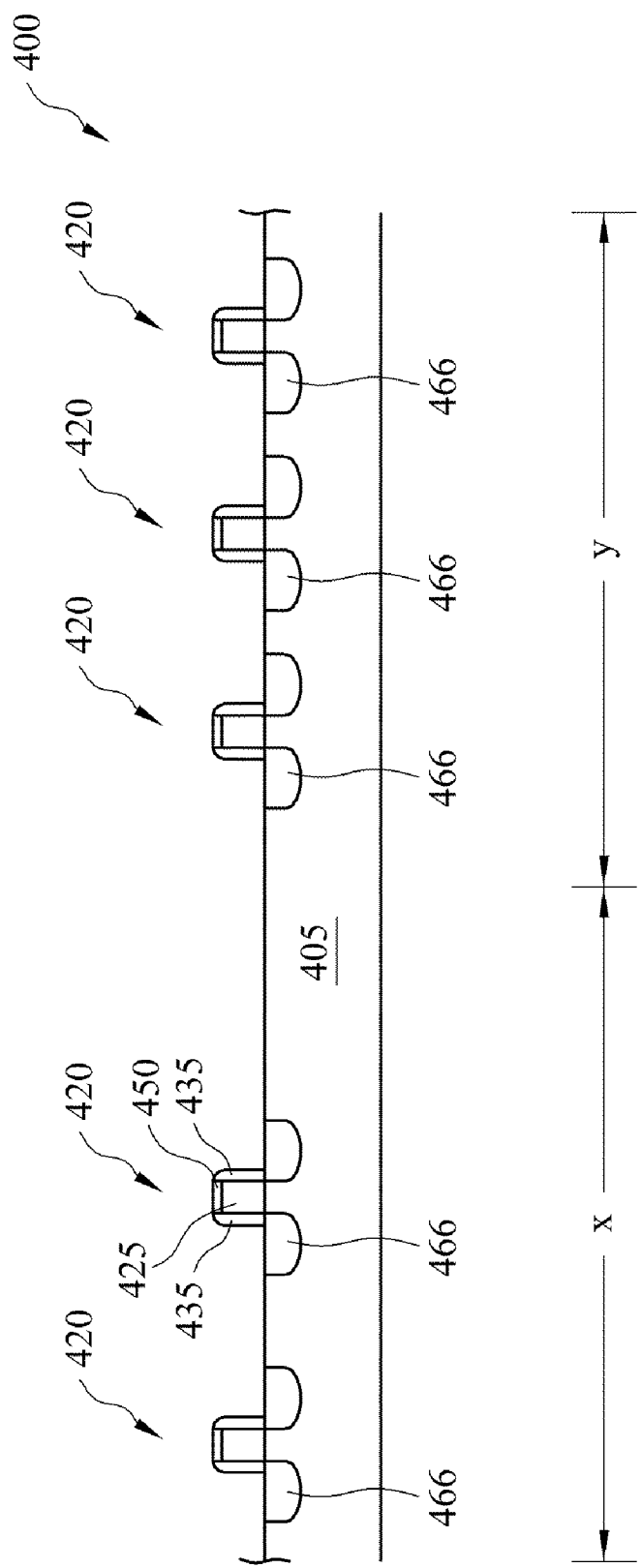

In the embodiment of FIGS. 4A through 4F, the remaining resist structures are then removed, and SEG used to create epitaxial regions 466 in the previously formed recesses 460 and 465, as illustrated in FIG. 4D. The epitaxial regions 466 may be formed of doped silicon or a silicon-germanium (SiGe) alloy. Carbon may also form or be included in the epitaxial-region material, for example using SiC. In one embodiment, an epitaxial material according to the formula $Si_{1-x}Ge_x$ may be used. Different materials may, in some instances, be used for different epitaxial regions, although this is not typical. The epitaxial regions 466 formed in recesses 460 and 465 may, for one example, be formed on the substrate using an ultra-high vacuum chemical-vapor deposition (UHV-CVD) process. Other processes known or developed in the art may be used as well.

Figure 4E:
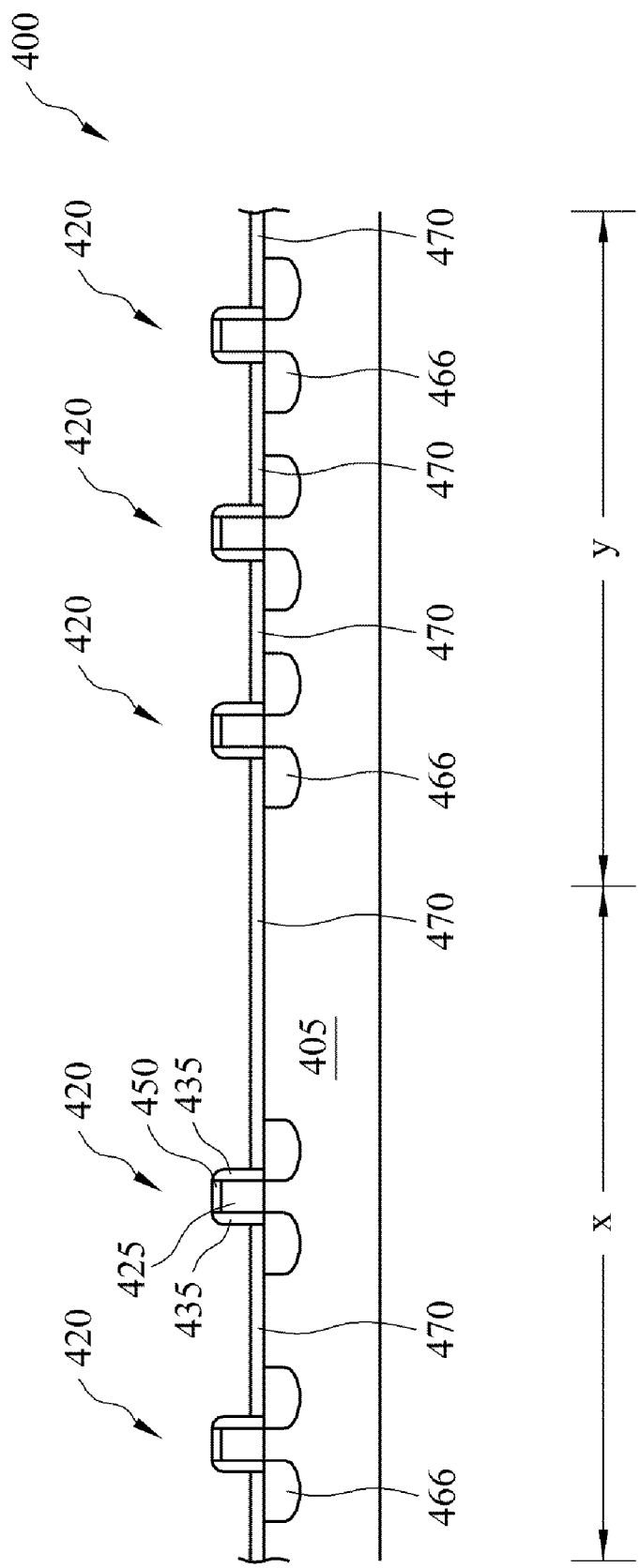
Figure 4F:
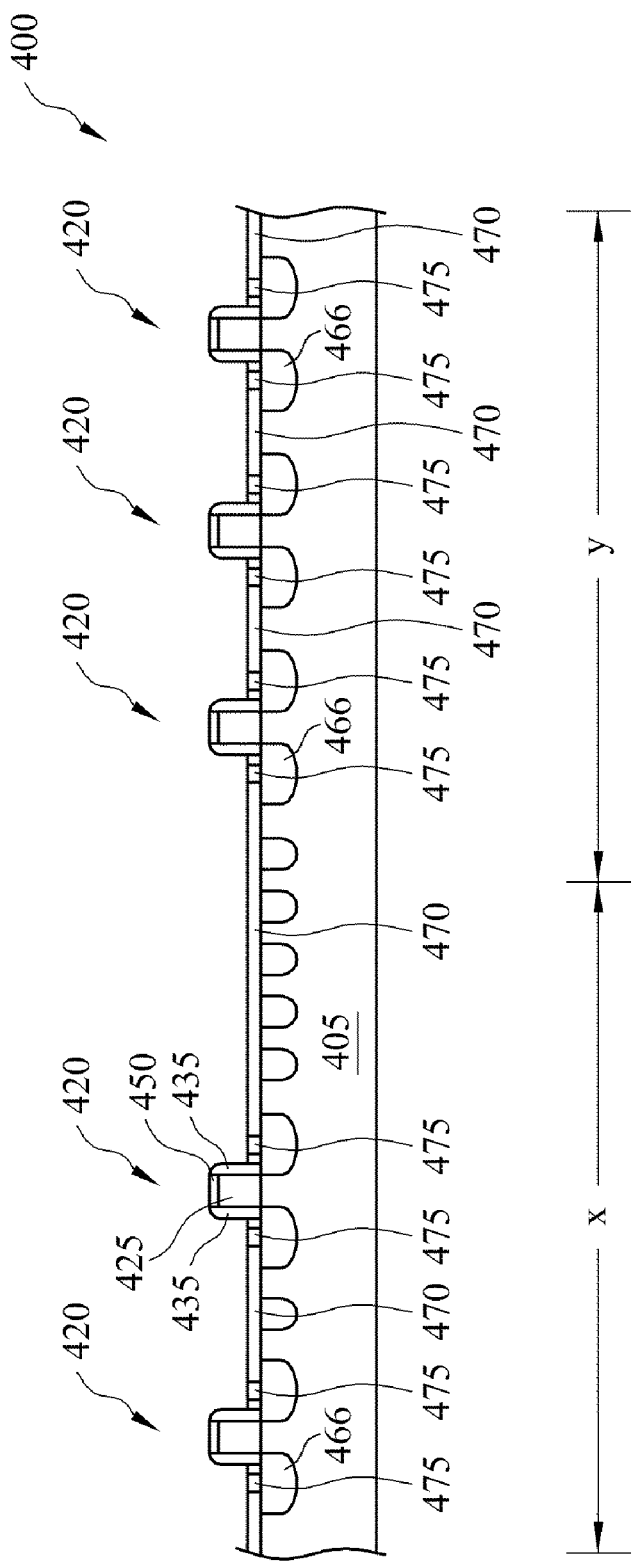

As should be apparent from a comparison between FIG. 4D and FIG. 3, described above, the use of a dummy pattern for epitaxial growth reduces the ratio of unpopulated to populated regions of semiconductor device 400 and results in superior formation of the source and drain regions. As shown in FIG. 4E, an insulating layer 470, such as one of $SiO_2$, is then deposited to isolate the newly filled recesses. In another embodiment of the present invention, SiN may be used as the insulator layer. Finally, the recesses 465 that are part of the dummy pattern will remain isolated, while conventional methods are used to form posts 475 or other conductors as contact structures for the sources and drain regions formed in recesses 460. FIG. 4F illustrates the semiconductor device 400 at this stage of fabrication.

A method embodiment is now described. An analysis approach is used to determine, for a selected wafer or integrated circuit design layout, where local loading effects in an epitaxial layer formation may occur. In performing selective epitaxial growth, the process may be characterized in that etch pattern photomasks are used that create open areas in dielectric layers over a substrate or silicon layer. The dielectric acts as a mask during the epitaxial growth process, so as more of the dielectric area is opened by an etch pattern mask, for example, more epitaxial coverage will occur. In one approach to the selective epitaxial growth, during a CVD process, gaseous materials are flowed over the device in a vacuum environment and epitaxial growth occurs only in the exposed areas, but not in areas covered by dielectric material, thus selective epitaxial growth is accomplished.

In an ideal situation, the concentration of the epitaxial material as a percentage would be more or less uniform across an entire semiconductor device, or wafer. If this were the case, then of course local loading effects would be eliminated, and thickness variations in the resulting epitaxial layer would not occur, or would be minimal. However in complex integrated circuit designs such as are now being produced in semiconductor processes, ideal situations do not occur. Instead, very significant differences in the epitaxial coverage of areas of the device create substantial variations in the coverage of the epitaxial material as provided in the design layout.

In present day integrated circuit designs, selective epitaxial growth is used to modify performance characteristics for devices, but only for certain ones of the devices on the integrated circuit. However in many areas of an integrated circuit, the epitaxial material is not used or is not needed. This means that for a practical layout for an integrated circuit there will always be areas of lower epitaxial concentration and other areas of greater epitaxial material concentration. For this discussion, a ratio of epitaxial area to the overall silicon area is expressed as a percentage, the epitaxial concentration ratio ("ECR") percentage.

Figure 5:
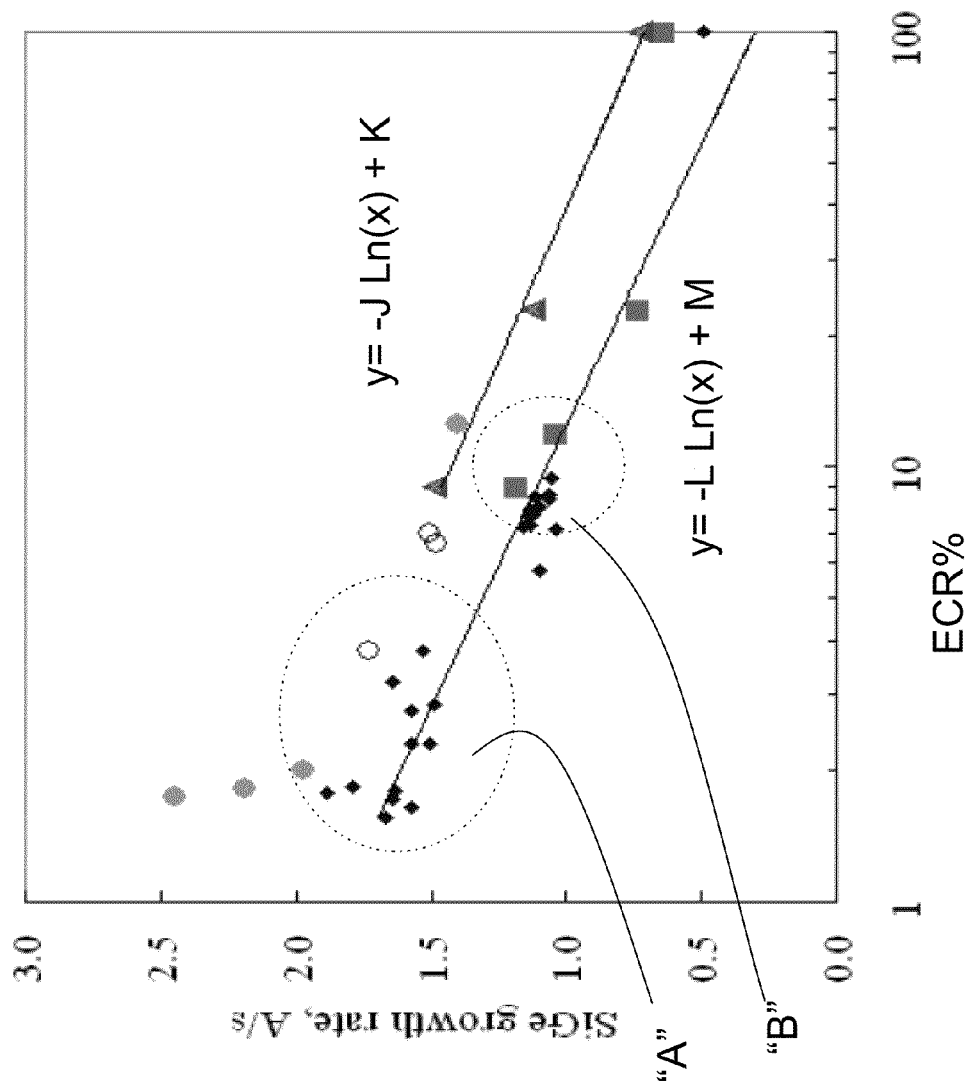
FIG. 5 illustrates experimental data observations of SiGe growth rates plotted against the epitaxial concentration ratio for devices, on a logarithmic scale.

FIG. 5 depicts experimental data points for different designs showing the growth rate of a typical epitaxial layer, here SiGe, plotted on a logarithmic scale against the ECR percentage for different devices. The data is shown plotted along a curve y=−(slope)*Ln(x)+(constant). The shapes plotted as data points indicate different designs; the diamond shapes are for one design, the rectangles another, etc. In FIG. 5, for the lowest ECR shown for a device, for example for the data points shaped as diamonds, in the area of ECR % of about 2-4%, is an area labeled "A". In area A the variation in epitaxial growth rate (expressed as Angstroms per second) is quite large. This is shown by the spread out diamond shapes, indicating widely varying SiGe growth rates. This observed variation in SiGe growth rate will result in a thickness variation in the finished integrated circuit device.

In contrast however, when the ECR % is slightly higher, the growth rate variation is lower. For example, see the area as shown in FIG. 5 as area "B"; for the diamond shapes plotted, this is around an ECR % of about 8%. In area B, the observed data points for SiGe growth rate are very tightly grouped. This indicates an improvement in the growth rate variation. Thus, a slight increase in the ECR % can have a significant improvement in the uniformity of the thickness of the epitaxial layer. The same effect can be seen for the other data points, the rectangles, and circles, of FIG. 5. Thus, as the ECR % increases to around 8%, the variation in SiGe growth rate is substantially reduced.

Figure 6:
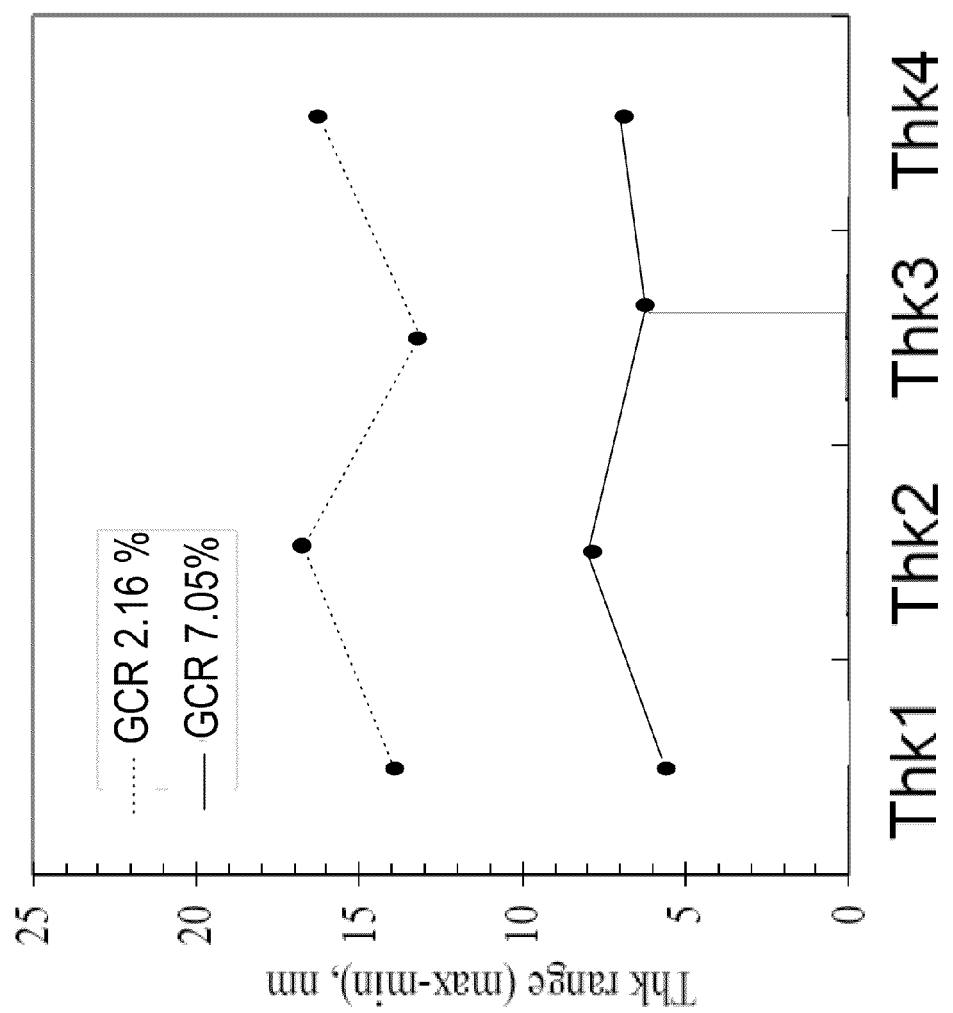
FIG. 6 illustrates in a graph the local loading effect induced variation of thickness obtained for epitaxial layers compared to the global concentration ratio for two devices.

This effect is further confirmed by the graph of FIG. 6. FIG. 6 illustrates in a graphical view the effect of local loading for SiGe areas on the thickness ranges obtained in a semiconductor process. A wide variation in selective epitaxial growth thickness is a problem that occurs due to local loading. For example, variation in SiGe thickness may lead to contact issues which can impact both device performance and yield.

The graph in FIG. 6 depicts a maximum delta thickness variation observed at points on a wafer, plotted for two cases of global epitaxial concentration ratio ("GCR"). The global concentration ratio is a percentage that indicates the coverage for the SiGe over the total area, a higher % for GCR indicates more SiGe coverage in this example, while a lower percentage indicates less SiGe coverage.

In FIG. 6, the case labeled "Thk1" indicates that the range of thickness of an epitaxial layer observed spans 14 nanometers (difference between maximum thickness and minimum thickness) for a device with a GCR of 2.16%, plotted as the dashed line. In contrast the range of thicknesses observed for a device with a GCR of 7.05%, plotted as the solid line, spans only approximately 6 nanometers. Thus the device with the higher GCR has a much lower thickness variation in the epitaxial layers, which is a substantial improvement in the local loading effect.

In FIG. 6, another case labeled Thk2 is presented. Again the GCR ratios are shown first for the case where the GCR is 2.16%, with a maximum observed thickness variation of 18 nanometers. For the case where the GCR is higher, at 7.05%, the thickness variation is again greatly improved; the maximum difference between thicknesses deposited is only 9 nanometers. For the case Thk3, the variation for the GCR of 2.16% is about 16 nanometers, while the thickness variation for the GCR of 7.05% is about 7 nanometers. Finally for the case Thk4, the thickness variation for the GCR case of 2.16% is quite large, about 18 nanometers, while for the case of GCR at 7.05%, it is about 8 nanometers.

Thus in each of the observed cases, the variation in epitaxial thickness is greatly improved when the GCR ratio is increased, even if the GCR is only moderately increased from about 2% to about 7%.

Figure 7:
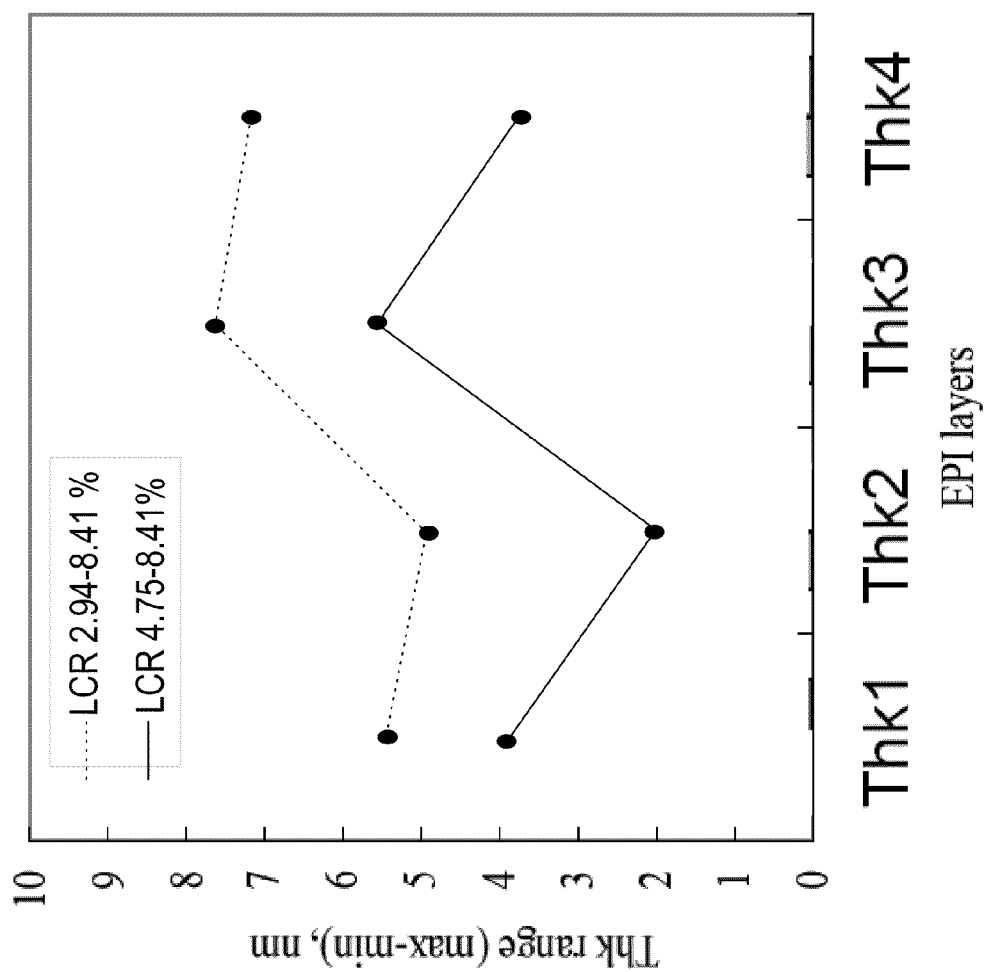
FIG. 7 illustrates in a graph the local loading effect induced variation of thickness obtained for epitaxial layers compared to the local concentration ratio spreads for two devices.

FIG. 7 provides a graph of observed thickness variations illustrating thickness variations in an epitaxial layer of SiGe when the thickness variations are observed for the local concentration ratio ("LCR"). The local concentration ratio % is determined looking at a small area, such as 1000 microns× 1000 microns, and the epitaxial layer coverage over the total available area determines the local concentration ratio as a percentage. A lower LCR % number indicates less epitaxial material is used per area, while a higher ratio indicates more epitaxial material coverage in the area.

In FIG. 7, the thickness variations observed for cases Thk1, Thk2, Thk3, Thk4 are illustrated and plotted graphically, in each case using a first area where the LCR is between 2.94-9.41% (plotted as the dashed line) and using a second area where the LCR is between 4.75-8.41%. (plotted as the solid line).

In FIG. 7 the case labeled Thk1 shows that the thickness variation observed for the lower concentration ratio (2.91-8.41%) was 5.5 nanometers. The thickness variation observed for the greater LCR ratio (4.75-8.41%) is 3.75 nanometers. The case labeled Thk2 shows for the lower ratio (2.91-8.41%) the thickness variation range was 5.5 nanometers. For the same case, when the LCR varies from 4.75-8.41%, the thickness variation ranges is about 2 nanometers. For the case labeled Thk3, the thickness shown for the lower ratio range spans a total of about 7.75 nanometers, and the thickness variation range spans a total of about 5.5 nanometers for the higher LCR (4.75-8.41%). Finally the case labeled Thk4 shows a thickness variation range of about 7 nanometers for the lower ratio and 3.5 nanometers for the higher LCR of 4.75-8.41%.

It has been discovered that surprisingly, a significant improvement in the deleterious local loading effects in a selective epitaxial growth layer can be obtained by increasing the local concentration ratio only slightly and only for those areas where the LCR % is below a minimum threshold ratio. Thus local loading can be improved in a design layout by altering it only for those local areas where the LCR % is below this minimum while the remaining areas that are already above this minimum are left unchanged. The import of this discovery is that it is not necessary to increase the concentration of epitaxial material in all areas, or to achieve a uniform or highly uniform concentration across a design; in fact significantly improved results may be obtained by increasing the concentration (e.g. adding dummy structures having the epitaxial layer) in only those areas where the least amount of coverage occurs. Since the use of dummy structures carries a cost in terms of silicon area, the use of the method embodiment provided here, where only the worst case local areas need to be adjusted with dummy structures, is highly desirable and lower in cost than prior approaches. Also, while it would be very costly and perhaps impractical to modify a design to have uniform LCR % across the design, the methods provided here are easily implemented and are not costly in terms of silicon area.

One implementation of a method embodiment is now described. An integrated circuit layout may be partitioned for this analysis into a plurality of small sub blocks. The local epitaxial concentration ratio ("LCR") % of each of these small sub blocks may be computed by determining the coverage over the area available in a sub block. A global concentration ratio may also be computed by averaging the LCRs for all of the sub blocks that make up a device.

FIG. 8 depicts in a simple graphical view the LCRs for one example chip design. In this chip design, the chip is divided into 10 sub block×10 sub block partitions. Each sub block partition has a size of 1000 microns by 1000 microns, or 1 mm by 1 mm. The LCR percentage for each sub block partition is represented by an integer in the graph. In other words, the highest LCR concentration sub block is represented by the integer 15 and the lowest LCR concentration sub block is represented by the integer 1. In the chip design of FIG. 8, the central portion of the device has higher and more uniform concentration of epitaxial growth, while the periphery has lower and less uniform concentration. This is not unusual. In many integrated circuits, larger transistors are used for the peripheral and I/O devices, and the use of epitaxial layers such as SiGe to improve performance, for example by introducing stress or strain to increase carrier mobility in MOS devices, is not needed for the peripheral and I/O devices. However, in the central portion of the integrated circuit, smaller transistors are often used in large arrays, for example, and to achieve the desired performance of these transistors, the design may include the addition of the selective epitaxial material.

FIG. 9 depicts a 19 block×19 block partition illustrating the calculated LCR % numbers for another chip design. In this example, the LCR percentages in the partitions are represented by integers from 0, for having no epitaxial deposition, to 14, for having the highest LCR percentage. Again the lower LCR % sub blocks are near the periphery of the device.

An important aspect of the analysis of the method embodiments is the decision of how fine (how small) the partition sub blocks should be. If the sub blocks are few in number and thus correspond to a larger area, the percentages will be more like a global concentration ratio (GCR). If, on the other hand, the partitions are very large in number, many sub blocks covering a smaller area each, the variation may be very wide, and the amount of computations may increase. When too many partitions are used, the beneficial effect of increasing the LCR % in the low LCR % partitions is found to reduce or disappear altogether. So a balance must be made between selecting too few, and too many, partitions for the analysis.

The selection of partition size is an important aspect of the method embodiments. Different sized partitions will be better for different designs and process conditions. During selective epitaxial growth processing, the gas flow rate and pressure are process dependent variables that affect the growth rate. The concentration of the epitaxial material is design dependent and that also has effects. Thus for a particular design layout manufactured in a particular process, different sized blocks may achieve different results in the methods described below. The selection process for partition size is one of experiment and results evaluation, a particular size is selected and a correlation factor is determined. For example in current process nodes, for designs that have been evaluated, 1000 microns by 1000 microns partitions have been used, also, 250 microns by 250 microns, and 500 microns by 500 microns. For each design the partition size is evaluated to determine the best partition size evaluating a correlation value, the $R^2$ factor.

Figure 10:
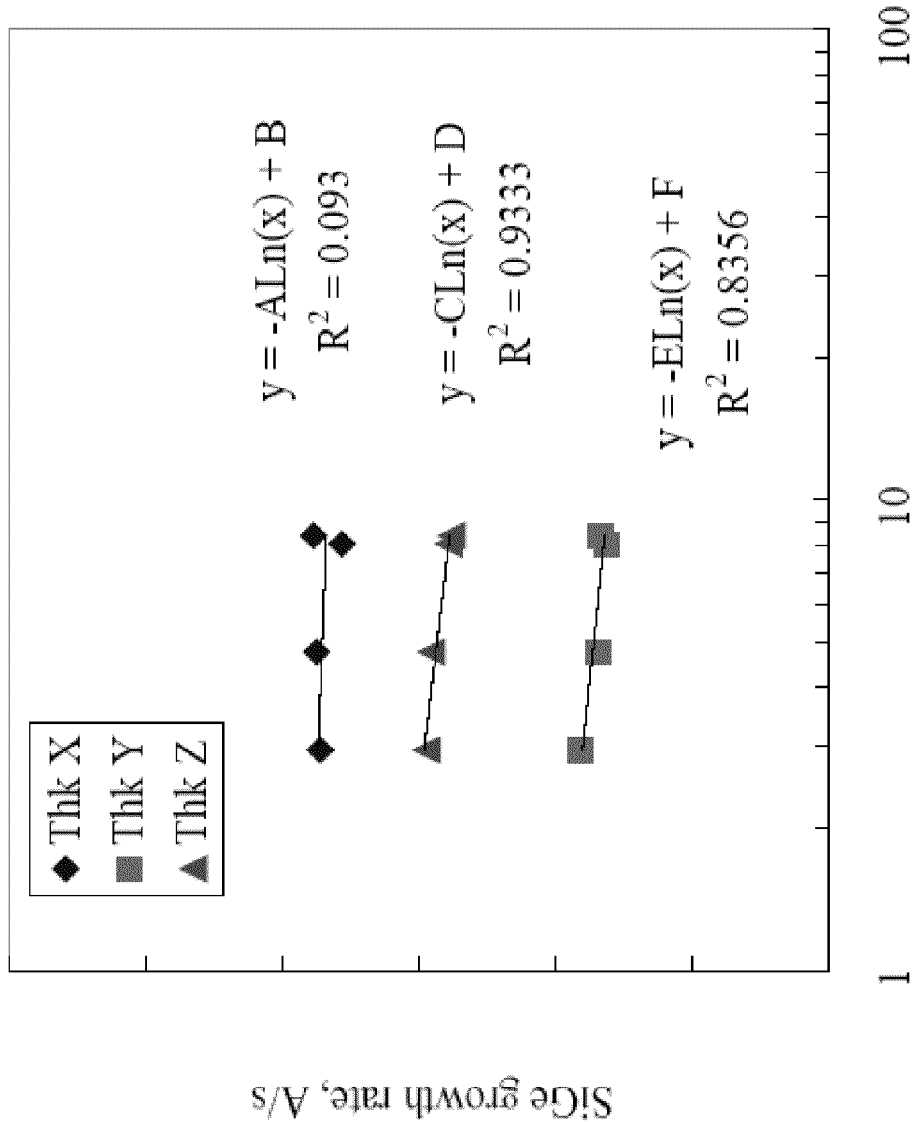
FIG. 10 illustrates in a flow chart the steps of a method embodiment for modifying the layout of an integrated circuit design to increase the concentration ratio for epitaxial material.

FIG. 10 depicts for three different thicknesses, Thk X, Thk Y, and Thk Z, for the epitaxial layer a plot of the deposition rate on the vertical axis versus the local concentration ratio (LCR), and a fitted line for each thickness generated from the measured deposition rate, along with a correlation value for the fit of the line. The data in FIG. 10 is plotted using a logarithmic scale according to general equation $y=-ALn(x)+B$.

For each of the three thicknesses that are selectively grown, the data points represent actual measured data. The diamond shaped data points are for a first thickness Thk X, the rectangles for another Thk Y, and the triangle shaped data for another, Thk Z. As seen in the figure, each thickness was evaluated at four data points corresponding to different LCRs. The selection of the block size will have an impact on the analysis of the design layout that follows and so is an important aspect of the embodiments.

For the example with a block size 1000 microns by 1000 microns, the chart shows that for thickness Thk1, indicated by the diamond shapes, the R value is low, with $R^2=0.093$. For the triangle shapes, the $R^2$ value is 0.93333, indicating a good correlation between the measured data and the calculated local concentration ratio. The $R^2$ value of the rectangular shapes is shown to be 0.8356, which is not as good. Similar plots and fitted lines can be made for LCRs calculated using other block sizes such as 500 microns by 500 microns, 250 microns by 250 microns, as non-limiting examples, and the best block size can be selected for the partition of a particular design layout based on the level of correlation.

Once the partition size is selected, the LCR % may be calculated for each sub block. After the LCR % is computed for the sub blocks, a looping or iterative approach may be used. For each sub block, a comparison is performed between the measured LCR % for the sub block and a minimum threshold percentage. For example, recalling FIG. 7, a lower LCR threshold of 4% could be used. This could be increased to 5% or more, but a range of 4-7% is considered a good range for the minimum LCR %. Each partition that has an LCR % that is less than this minimum threshold is identified from the design layout.

After those sub blocks are identified, then for those partitions only, the concentration of epitaxial material is increased. This may be accomplished, for example, by adding the selective epitaxial growth to dummy structures located within the identified sub blocks. The LCR % can be increased by altering the design layout to add areas where the selective epitaxial layers will be deposited to include the dummy structures within the sub block, or to move components in the design between partitions. Because the dummy structures will be electrically isolated from the remainder of the design in the finished semiconductor device, the overall device functionality is not affected as long as components are not moved too far so as to affect device speed.

Again, following the revisions to the design layout, the design may be analyzed and for each sub block, the comparison is made. Once there are no more sub blocks with an LCR % that is less than the desired minimum, the loop can end. In some cases, design alterations to increase LCR % for certain sub blocks are too difficult or costly in terms of device performance or area. In these cases, the LCR % in neighboring partitions may be increased to above that of the minimum LCR % to compensate. That is, for any attempt to add epitaxial coverage to a sub block where the area is not available to do so, the local coverage may be increased by adding selective epitaxial growth in neighboring sub blocks and thus increasing the coverage in the neighboring sub blocks, instead. This approach may be applied to any of the embodiments described herein and is contemplated as an additional alternative embodiment to all the embodiments.

In a further method embodiment, another calculation that may be made is to compute the global concentration ratio (GCR %). As shown in FIG. 6, if the GCR % is increased above about 7%, then the epitaxial layer thickness variation range is greatly reduced. This is also confirmed by the log scale in FIG. 5 showing the growth rate variation data for experiments conducted with different GCRs. If the design, after the alterations to the design layout is made, has a GCR of greater than 7%, then improved local loading effects for the epitaxial layers will occur. If the GCR obtained is still below a selected threshold parameter, for example less than 7%, then in another alternative embodiment the LCR concentration can be increased still further for certain sub blocks, and the method for revising the design layout could be iteratively performed. This process could be continued until a desired GCR % is obtained for the design layout. Note that the calculation for GCR % can occur before or after the LCR calculations.

After the design layout had been modified by adding epitaxial layers to at least some of the dummy structures within the least covered partitions, the semiconductor fabrication process may be performed to deposit the selective epitaxial layer. Gaseous materials flowed in a chemical vapor deposition chamber under vacuum (100 torr to a few mtorr) may be used to deposit the epitaxial layers.

Alternatively, different approaches may be used. The order of steps may be varied, and still the methods may be performed. More generally a design layout for a semiconductor device having at least some areas configured for selective epitaxial growth is partitioned into sub blocks. Each sub block has a computed local epitaxial concentration ratio, LCR %. For each sub block, the LCR % is compared to a predetermined minimum threshold. For any sub block where the LCR % is below the predetermined minimum threshold, the LCR % may be increased by modifying the design layout to add selective epitaxial regions to dummy structures within the sub block. Once the sub blocks are all analyzed, the modified design layout is used to perform selective epitaxial growth on a semiconductor substrate to form the device. Epitaxial material will be selectively grown in active areas that were part of the original design layout, and in dummy structures as added by the above modifications to the design layout. Local loading effects will be reduced.

Figure 11:
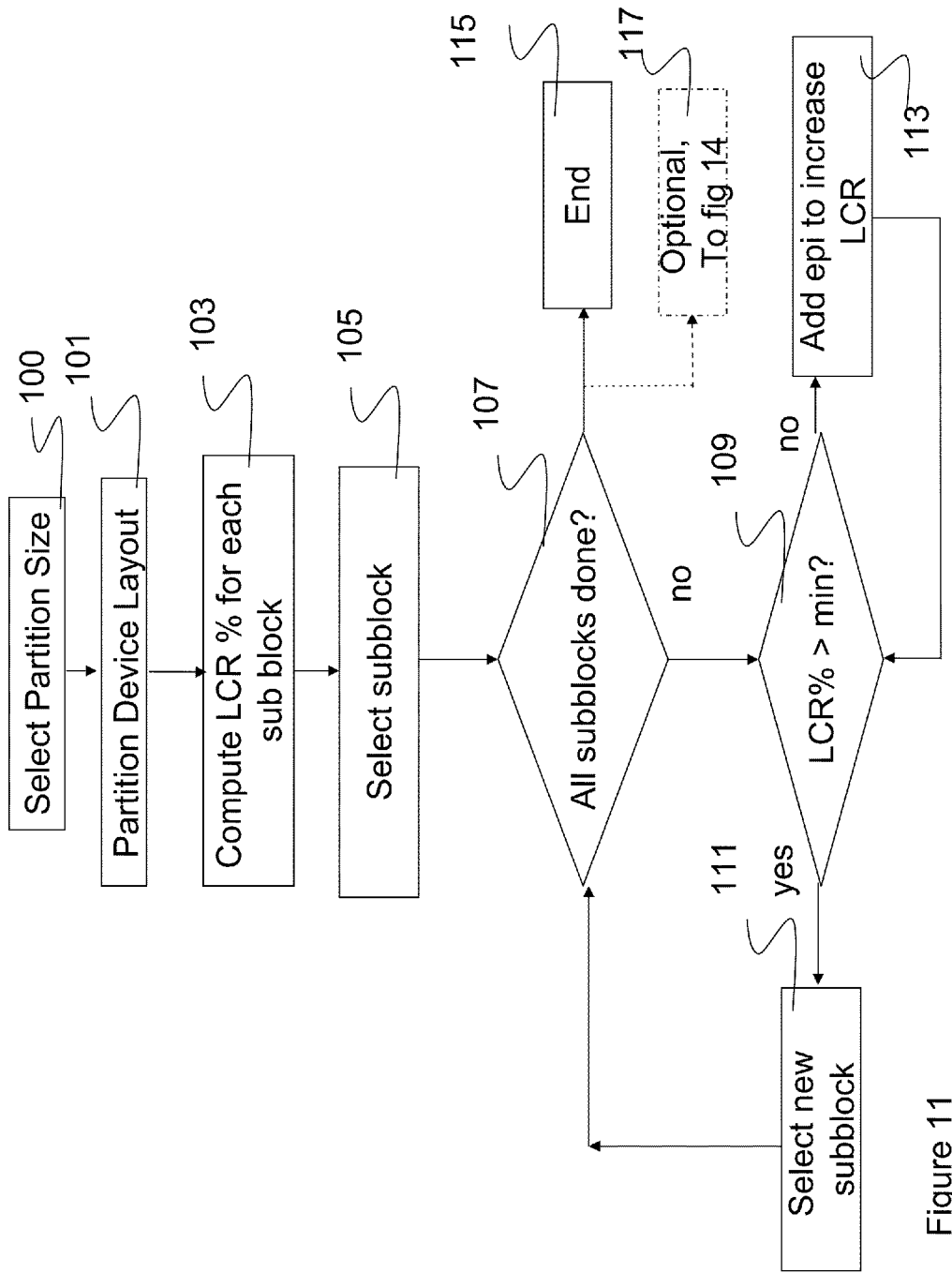
FIG. 11 illustrates in a flow chart the steps of another alternative method embodiment for modifying the layout of an integrated circuit design to increase the concentration ratio for epitaxial material.

FIG. 11 illustrates one possible implementation of a method embodiment in a flow chart diagram. In state 100, the design layout is received and a partition size is selected. As described above this process may take the form of experimentally evaluating several possible partition sizes and selecting the one that provides the best correlation value. In state 101, the device layout is then partitioned into sub blocks of the selected size. The device layout includes information stored as photomask, layout shapes, and metallization patterns; etch patterns, and the like. The device is partitioned in state 101 into a number of sub blocks as discussed above. In state 103, the LCR %, that is the ratio of covered area using the selective epitaxial material to the total area available in the sub block expressed as a percentage, is computed for each sub-block. At step 105 a first sub block is selected. At step 107 an iterative process begins. Starting with the initially selected sub block, each sub block in the design layout will be analyzed until all of the sub blocks are analyzed. For example if the partition is 100×100 sub blocks, then 10,000 sub blocks will be analyzed. Workstations or computers with access to the design layout information for the device to be made can be used, dedicated microprocessors or programmable processors may be used, and graphical displays may be used to perform the method as described here. Software may be written and stored in a computer readable medium such as a flash drive, CD-ROM, CD, DVD, diskette, EEPROM, or as a file in a server or connected to a processor over the internet, for example, this computer software can be written to cause the methods to be performed. The software may be stored in executable form and when executed, may cause a programmable processor to perform the method embodiments.

In state 107, the looping or iterative begins. In state 107, a decision is made whether all sub blocks in the partitioned design have been analyzed. This may be performed by, for example, comparing the total sub blocks analyzed to the maximum number of sub blocks. In state 109, a comparison is made for the particular sub block currently selected. If the LCR % for the sub block exceeds a selected minimum threshold, then the process transitions to state 111. If the LCR % is below the minimum threshold for LCR %, then the process transition to state 113.

In state 113, the design layout is modified to increase the LCR % for the selected sub block. This may be done by adding epitaxial material to dummy structures located within a sub block. To implement a change to the design layout, photomask modifications may be made. In one example, a photomask may be modified to open additional areas in a dielectric layer during the selective epitaxial growth. Opening additional areas in the dielectric layer will expose additional silicon areas in dummy structures during the subsequent CVD process for selective epitaxial growth, thereby increasing the epitaxial coverage and the LCR % in the sub block being analyzed. After this step, the process transitions back to state 109 to confirm the sub block now has an LCR % that exceeds the minimum threshold. This process may iterate multiple times, but eventually the process will transition to state 111 where another sub block is selected. The loop continues at state 107. Once all of the sub blocks in the design layout have been processed, the process will transition to state 115 and end. Optionally, in an alternative embodiment method, the process may transition to state 117. From state 117 the process may enter the GCR coverage evaluation flow shown in FIG. 14. This additional evaluation may provide even better local loading effect results, as is described in more detail below.

Figure 12:
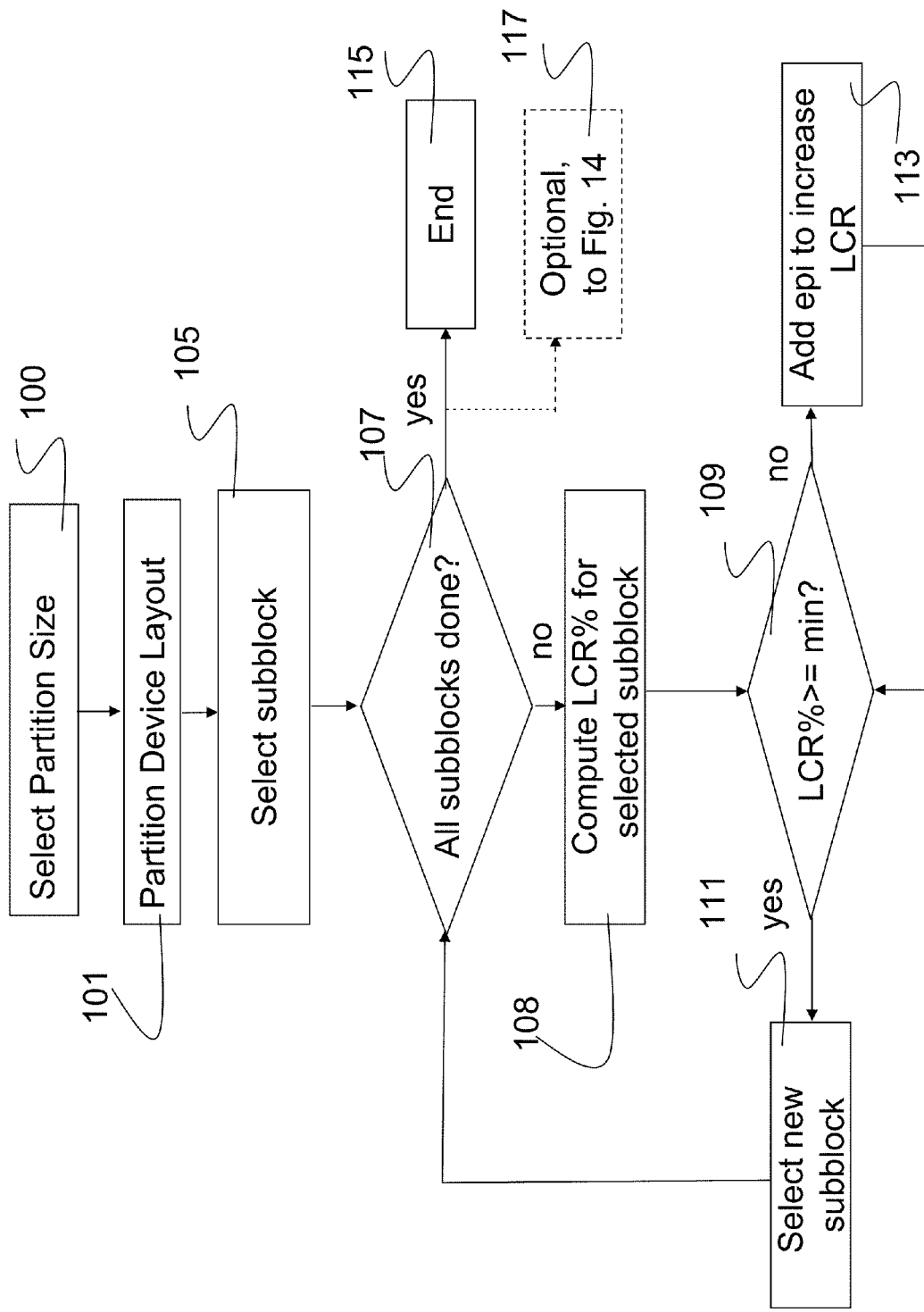
FIG. 12 illustrates in a flow chart the steps of an another alternative method embodiment for modifying the layout of an integrated circuit design to increase the concentration ratio for epitaxial material.

FIG. 12 now depicts an alternative flow diagram for a method embodiment. The method of FIG. 12 is similar to FIG. 11 in many respects but the order of the steps is changed. Other changes to the order of the steps are also possible and are contemplated as alternative embodiments of the methods disclosed herein, and are within the scope of the appended claims.

In the illustrative embodiment of FIG. 12, the flow diagram begins at state 100; again a partition size is selected for the particular design layout. The design is then partitioned at state 101 into sub blocks. An initial sub block is selected at state 105, and then an iterative loop or process begins at state 107. After checking to see if all sub blocks have been analyzed, the flow diagram transitions to state 108. In state 108, the LCR % for the selected sub block is now computed. At state 109 the LCR % is compared to a predetermined minimum threshold. If the LCR % is greater than or equal to the minimum threshold, the process continues at state 111, by selecting another sub block. If instead the LCR % is below the minimum threshold, the state transitions to state 113 where the LCR % for the selected sub block is increased. This may be done, for example, as described above by modifying the design to activate epitaxial regions for dummy structures within the sub block. The photomasks for the design layout will be modified, for example the etch mask for a dielectric layer that is used to determine the areas for selective epitaxial growth may be modified to open additional areas corresponding to the dummy structures within the sub block, thus increasing the epitaxial material within the sub block. Once the selected sub block has a computed LCR % that exceeds the predetermined minimum, the flow continues at state 107 until each sub block is analyzed. After the last sub block is analyzed, the flow may end at state 115. Alternatively, the state diagram may flow to the GCR method embodiment of FIG. 14, as shown in state 117.

Figure 13:
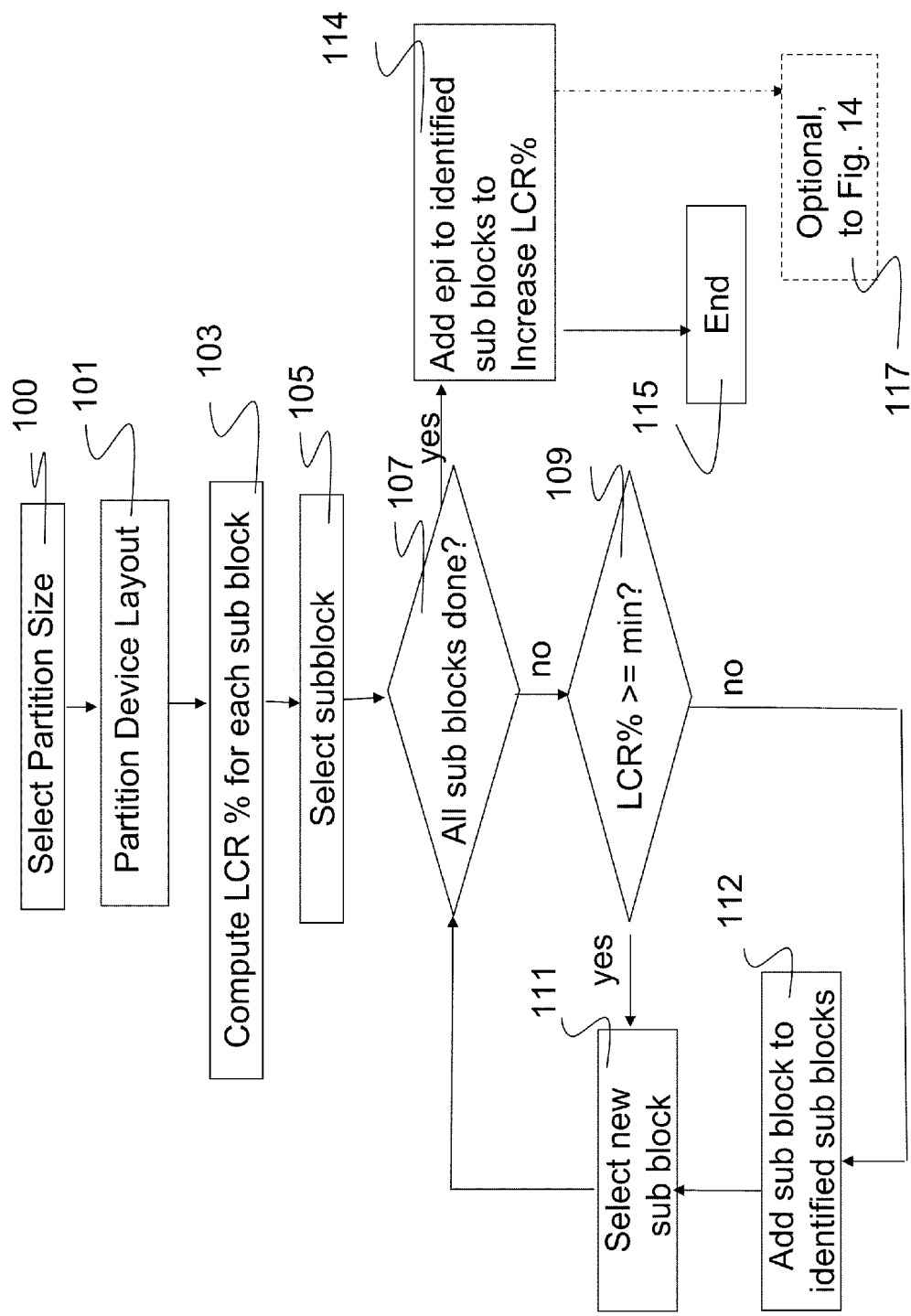
FIG. 13 illustrates in a flow chart the steps of an additional alternative method embodiment for modifying the layout of an integrated circuit design to increase the concentration ratio for epitaxial material.

FIG. 13 depicts yet another alternative flow diagram for a method embodiment. In FIG. 13 the flow diagram again begins at state 100 with the selection of a partition size for the design layout. In state 101 the design is partitioned into sub blocks. In state 103 the LCR % ratio for each sub block is computed. In state 105, the initial sub block is selected. In state 107 an iterative method begins as described above. In the flow diagram at state 109, the selected sub block is checked to see if the computed LCR % for the selected sub block is greater than or equal to a predetermined minimum threshold. If the LCR % for the selected sub block is greater than or equal to the minimum, the flow diagram continues to state 111 and another sub block is selected. If the comparison is not met, the flow diagram transitions to state 112, and the selected sub block is placed on a list of identified sub blocks. In FIG. 13, after the sub blocks have all been analyzed, the flow diagram transitions to state 114. In this state, each of the identified sub blocks is modified by increasing the epitaxial material coverage. This is done, for example, as described above by changing the photomasks for the design layout to cause more epitaxial material to concentrate in the selected sub blocks. Once the identified sub blocks have their LCR % increased, the flow ends at state 115. Again, optionally, the flow may transitions to state 117 where the method continues further in the GCR evaluation of FIG. 14.

Figure 14:
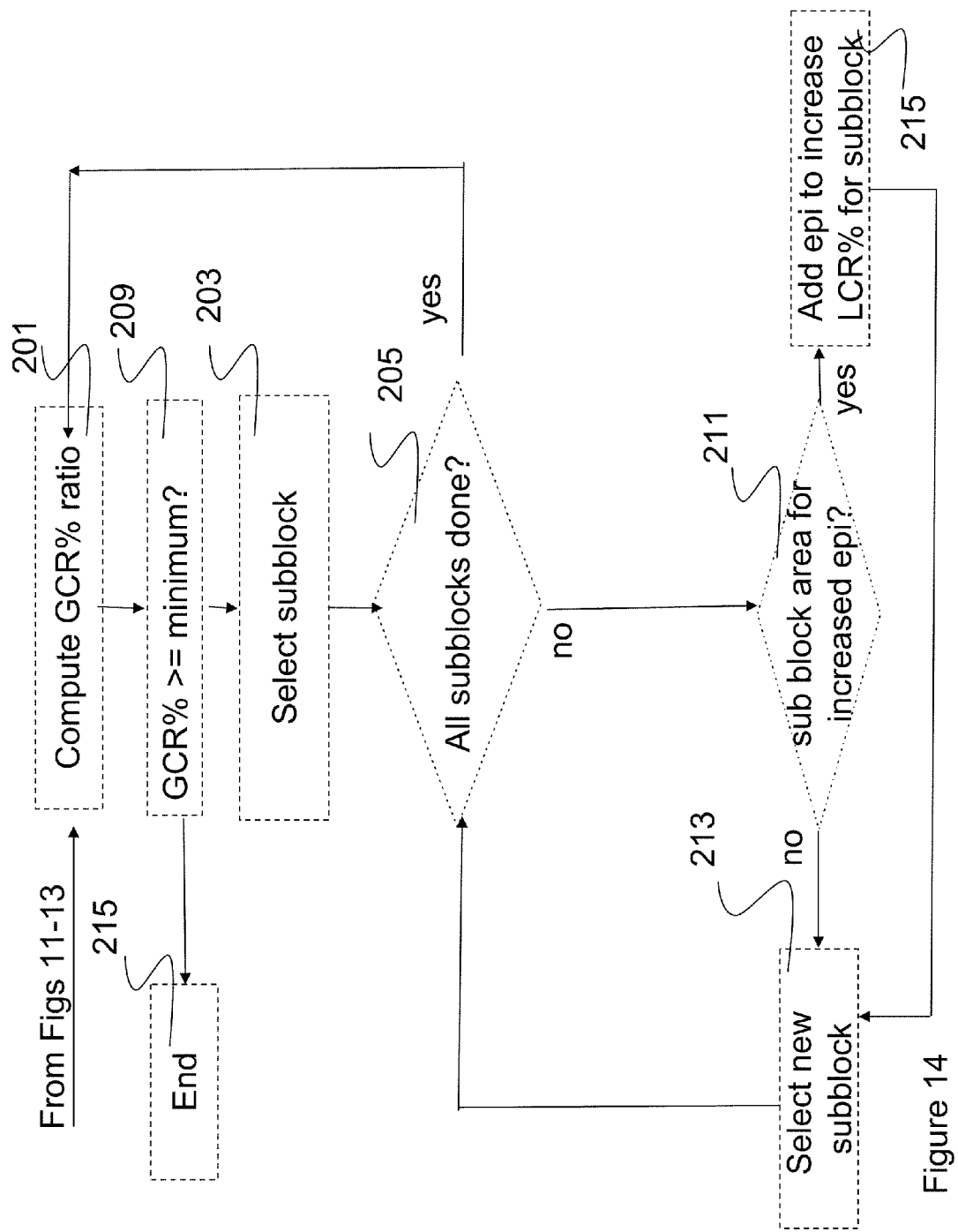
FIG. 14 illustrates in a flow chart the steps of an additional optional alternative method embodiment for modifying the layout of an integrated circuit design to increase the global concentration ratio for epitaxial material.

In FIG. 14 a flow diagram for an illustrative method for measuring the global coverage ratio (GCR) for a design layout is depicted. This embodiment method may be used in addition to any of the methods shown in FIGS. 10, 11 and 12 above, or as an independent method for improving local loading effects in selective epitaxial growth. In FIG. 13 the state boxes are shown dashed. This is to indicate this is an optional additional method embodiment.

In state 201, the GCR % for a design layout is calculated. This is done by combining the LCR % for the sub blocks in an averaging operation. In state 209 the GCR % is compared to a minimum threshold for GCR %. For many designs this minimum will be met, as the GCR is an average of the LCR % for the sub blocks, if it is met then the flow ends at state 215. If the GCR % threshold is not met, then the design is further analyzed. In state 203 a sub block is selected. In state 205 another iterative loop begins. In state 211, the design is evaluated and the selected sub block is evaluated to see if additional area is available for epitaxial growth. If so, the flow diagram transitions to state 215 and the design is modified for that sub block to add additional epitaxial growth. This process continues and a new sub block is selected at state 213. These sub blocks then receive modification to increase epitaxial material which increases both the local LCR % for the sub block and the GCR % for the design layout. As shown in FIG. 5, when the GCR % is increased, the uniformity of the epitaxial grown layers are improved and local loading effects are also improved for the selective epitaxial growth.

It has now been surprisingly determined that major improvements in local loading effects, as evidenced by for example, epitaxial thickness variation ranges, for a selective epitaxial growth process can be achieved using an embodiment of this application to adjust only selected areas of a design layout. This is done by adjusting the epitaxial coverage in only sub blocks identified as having the lowest concentration ratio areas. That is, instead of performing a matching or equalization process across an entire design layout, a method embodiment is provided where only the lowest epitaxial concentration ratio areas are increased. This is done by modifying a design layout to add epitaxial material to dummy areas in selected sub blocks. This slight increase in the LCR % provides a significant improvement in the epitaxial layer thickness variations. The dummy structures are typically already part of the design layout; alternatively, additional dummy structures may be added to the design layout. It has now been surprisingly discovered that only a relatively slight change to the design, increasing the LCR % slightly and only in these selected areas, can have a significant beneficial impact on local loading effects.

The methods for reducing local loading effects can be applied to the use of selective epitaxial growth in recesses for the source and drain regions of transistors, as described above. Further, other applications may include other epitaxial layers where local loading effects occur. The increase of concentration of epitaxial material to reduce local loading, by identifying only the lowest areas of epitaxial concentration in a design layout and increasing the epitaxial concentration only in those areas, may be applied in a wide variety of contexts in semiconductor processes.

Although the present invention and its advantages have been described in detail, it should be understood that various changes, substitutions and alterations can be made herein without departing from the spirit and scope of the invention as defined by the appended claims. For example, method steps may be performed simultaneously or in series, or in any different, logically-permissible order. Equivalent processes or materials, other than those mentioned, may also be utilized without departing from the spirit of the invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of making a semiconductor device, comprising the steps of:
   providing a semiconductor substrate, the substrate having an upper surface;
   receiving a design layout to be implemented on the semiconductor substrate, the design layout including a plurality of active areas configured for selective epitaxial growth;
   partitioning the design layout into sub blocks;
   for each of the sub blocks, determining a local epitaxial concentration ratio percentage within the sub block;
   selecting one or more low epitaxial concentration sub blocks by determining whether the local epitaxial concentration ratio percentage of each sub block is below a predetermined minimum percentage;
   increasing the local epitaxial concentration ratio percentage by modifying the design layout within the selected one or more low epitaxial concentration sub blocks to add dummy areas configured for selective epitaxial growth until the local epitaxial concentration ratio percentage within the selected one or more low epitaxial concentration sub blocks exceeds the predetermined minimum percentage;
   calculating for the design layout a global epitaxial concentration ratio percentage by combining the local epitaxial concentration ratio percentages for the sub blocks;
   determining whether the global epitaxial concentration ratio percentage is below a predetermined minimal global epitaxial concentration ratio percentage;
   subject to the determining whether the global epitaxial concentration ratio percentage is below a predetermined minimal global concentration ratio percentage, identifying selected sub blocks with area available for additional selective epitaxial growth;
   for the selected sub blocks identified with area available, increasing the local epitaxial concentration ratio percentage by adding additional dummy areas configured for selective epitaxial growth;
   repeating the determining whether the global epitaxial concentration ratio percentage is below the predetermined minimal global epitaxial concentration ratio percentage, the identifying selected sub blocks with area available, and the increasing the local epitaxial concentration ratio percentage until the global epitaxial concentration ratio percentage for the design layout exceeds the predetermined minimal global epitaxial concentration ratio percentage; and
   using the design layout including the modifications made to the design layout, performing selective epitaxial growth on the surface of the semiconductor substrate.

2. The method of claim 1 wherein the predetermined minimum percentage is greater than four percent.

3. The method of claim 1 wherein partitioning the design layout further comprises selecting a sub block size and partitioning the design layout into sub blocks.

4. The method of claim 1 wherein the predetermined minimum percentage is about four to about seven percent.

5. The method of claim 1, wherein performing selective epitaxial growth comprises:
   forming a first recess in the upper surface of the substrate, the first recess in one of the active areas;
   forming at least a second recess in the upper surface of the substrate, the second recess in a dummy area;
   growing a first epitaxial region in the first recess and
   a second epitaxial region in the second recess;
   wherein the second epitaxial region is electrically isolated so as to function as a dummy structure.

6. The method of claim 5, wherein performing selective epitaxial growth further comprises forming an insulating layer over the second epitaxial region.

7. The method of claim 5, wherein each of the first epitaxial region and the second epitaxial region comprise a material one selected from the group consisting essentially of germanium and carbon.

8. The method of claim 5, wherein each of the first epitaxial region and the second epitaxial region further comprise silicon germanium.

9. The method of claim 5, wherein each of the first epitaxial region and second epitaxial layer comprise Si1-xGex, wherein x is a variable having a value between 0 and 1.

10. The method of claim 5, wherein the first recess is formed within a source region.

11. A method of forming a semiconductor device, comprising:
   receiving a design layout for active devices including source and drain regions for transistors, at least some of the source and drain regions configured to receive selective epitaxial growth;
   partitioning the design layout into sub blocks;
   for each of the sub blocks, determining a local epitaxial concentration ratio percentage within the sub block;
   selecting one of the sub blocks for analysis;
   determining whether the local epitaxial concentration ratio percentage of the selected sub block is below a predetermined minimum percentage;
   subject to the determining, modifying the design layout of the selected sub block to add selective epitaxial growth material to dummy structures within the sub block until the local epitaxial concentration ratio percentage is equal to or exceeds the predetermined minimum percentage or until all dummy structures in the sub block include selective epitaxial growth material;
   selecting another sub block and performing the determining and increasing for each sub block until all sub blocks have been selected;
   after all sub blocks have been selected once, for each sub block, re-determining the local epitaxial concentration ratio percentage within the sub block; and for each sub block having a local epitaxial concentration ratio percentage below the predetermined minimum percentage, modifying the design layout of a neighboring sub block to add selective epitaxial growth material to dummy structures within the sub block to increase the local epitaxial concentration ratio percentage of the neighboring sub block to above the predetermined minimum percentage; and using the design layout including the modifications made to the design layout, performing selective epitaxial growth on a surface of a semiconductor substrate.

12. The method of claim 11 wherein performing the selective epitaxial growth comprises performing selective growth of silicon carbon or silicon germanium epitaxial material.

13. The method of claim 11 wherein the predetermined minimum percentage is greater than four percent.

14. The method of claim 11 wherein the predetermined minimum percentage is between four and seven percent.

15. A method for forming a semiconductor device, comprising:
receiving a design layout configured to form MOS transistors on the semiconductor device, including regions for selective epitaxial growth;
partitioning the design layout into sub blocks;
for each of the sub blocks, determining a local epitaxial concentration ratio percentage within the sub block;
identifying the sub blocks in which the local epitaxial concentration ratio percentage is below a predetermined minimum percentage threshold;
for the identified sub blocks, increasing the local epitaxial concentration ratio percentage by modifying the design layout to add selective epitaxial growth material to dummy structures within the identified sub blocks;
repeating the determining, identifying, and increasing the local epitaxial concentration ratio percentage until each sub block has a local epitaxial concentration ratio percentage that exceeds the predetermined minimum percentage threshold;
determining a global epitaxial concentration ratio percentage for the design layout;
comparing the determined global epitaxial concentration ratio percentage to a predetermined minimum global epitaxial concentration ratio percentage;
responsive to the comparing, iteratively increasing the local epitaxial concentration ratio percentage for certain sub blocks until the global epitaxial concentration ratio percentage exceeds the predetermined minimum global epitaxial concentration ratio percentage; and
using the design layout including the modifications made to the design layout, performing selective epitaxial growth on a semiconductor substrate to form epitaxial material in the regions and the dummy structures.

16. The method of claim 15 wherein the epitaxial material comprises silicon germanium or silicon carbon.

17. The method of claim 15 wherein the predetermined minimum global epitaxial concentration ratio percentage is seven percent.

18. The method of claim 15 wherein the regions comprise source and drain regions having recesses to form p-type MOS transistors.

19. The method of claim 15 wherein the predetermined minimum percentage threshold is four percent.

* * * * *